United States Patent
Nakagawa et al.

(10) Patent No.: US 10,620,534 B2
(45) Date of Patent: Apr. 14, 2020

(54) FLUORINE-CONTAINING POLYMER, PURIFICATION METHOD, AND RADIATION-SENSITIVE RESIN COMPOSITION

(71) Applicant: JSR CORPORATION, Tokyo (JP)

(72) Inventors: Hiroki Nakagawa, Tokyo (JP); Hiromitsu Nakashima, Tokyo (JP); Gouji Wakamatsu, Tokyo (JP); Kentarou Gotou, Tokyo (JP); Yukio Nishimura, Tokyo (JP); Takeo Shioya, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/104,182

(22) Filed: Aug. 17, 2018

(65) Prior Publication Data

US 2019/0025695 A1   Jan. 24, 2019
US 2019/0278175 A9   Sep. 12, 2019

Related U.S. Application Data

(63) Continuation of application No. 15/299,871, filed on Oct. 21, 2016, now Pat. No. 10,082,733, which is a continuation of application No. 14/933,641, filed on Nov. 5, 2015, now Pat. No. 9,500,950, which is a continuation of application No. 14/178,622, filed on Feb. 12, 2014, now Pat. No. 9,213,236, which is a continuation of application No. 12/294,386, filed as application No. PCT/JP2007/056094 on Mar. 23, 2007, now Pat. No. 8,697,343.

(30) Foreign Application Priority Data

Mar. 31, 2006 (JP) .................... 2006-099889
Jun. 14, 2006 (JP) .................... 2006-165310
Sep. 12, 2006 (JP) .................... 2006-247299
Jan. 19, 2007 (JP) .................... 2007-010765

(51) Int. Cl.
| | |
|---|---|
| G03F 7/004 | (2006.01) |
| G03F 7/039 | (2006.01) |
| G03F 7/20 | (2006.01) |
| G03F 7/38 | (2006.01) |
| G03F 7/40 | (2006.01) |
| C08F 220/18 | (2006.01) |
| C08F 220/24 | (2006.01) |
| C08F 220/28 | (2006.01) |
| G03F 7/16 | (2006.01) |
| G03F 7/32 | (2006.01) |

(52) U.S. Cl.
CPC .......... *G03F 7/0046* (2013.01); *C08F 220/18* (2013.01); *C08F 220/24* (2013.01); *C08F 220/28* (2013.01); *G03F 7/0045* (2013.01); *G03F 7/039* (2013.01); *G03F 7/0397* (2013.01); *G03F 7/162* (2013.01); *G03F 7/168* (2013.01); *G03F 7/2006* (2013.01); *G03F 7/2041* (2013.01); *G03F 7/322* (2013.01); *G03F 7/38* (2013.01); *G03F 7/40* (2013.01)

(58) Field of Classification Search
CPC ........ G03F 7/004; G03F 7/0046; G03F 7/039; G03F 7/0392; G03F 7/0397
See application file for complete search history.

(56) References Cited

U.S. PATENT DOCUMENTS

| | | | |
|---|---|---|---|
| 6,358,665 B1 | 3/2002 | Pawlowski et al. | |
| 6,414,110 B1 | 7/2002 | Sheehan et al. | |
| 6,492,091 B2 * | 12/2002 | Kodama | G03F 7/0045 430/270.1 |
| 6,582,880 B2 | 6/2003 | Harada et al. | |
| 6,593,058 B1 | 7/2003 | Feiring et al. | |

(Continued)

FOREIGN PATENT DOCUMENTS

| | | |
|---|---|---|
| CN | 1881085 | 12/2006 |
| EP | 1367440 | 12/2003 |

(Continued)

OTHER PUBLICATIONS

Chinese Office Action for corresponding CN Application No. 200780007265.2, dated Apr. 13, 2010 (w/ English translation).

(Continued)

*Primary Examiner* — Anca Eoff

(74) *Attorney, Agent, or Firm* — Oblon, McClelland, Maier & Neustadt, L.L.P.

(57) ABSTRACT

An object of the present invention is to provide a novel fluorine-containing polymer, a radiation-sensitive resin composition for liquid immersion lithography which contains the fluorine-containing polymer, which leads to a pattern having an excellent shape and excellent depth of focus, wherein the amount of an eluted component in a liquid for liquid immersion lithography such as water that comes in contact with the resist during exposure in liquid immersion lithography is little, and which provides a larger receding contact angle between the resist film and the liquid for liquid immersion lithography such as water, and a method for purifying the fluorine-containing polymer. The present resin composition comprises a novel fluorine-containing polymer (A) containing repeating units represented by the general formulae (1) and (2) and having Mw of 1,000-50,000, a resin (B) having an acid-unstable group, a radiation-sensitive acid generator (C), a nitrogen-containing compound (D) and a solvent (E).

14 Claims, 1 Drawing Sheet

(56) References Cited

U.S. PATENT DOCUMENTS

| | | |
|---|---|---|
| 6,790,591 B2 | 9/2004 | Harada et al. |
| 6,800,419 B2 | 10/2004 | Soyano et al. |
| 7,781,142 B2 | 8/2010 | Chiba et al. |
| 8,119,321 B2 | 2/2012 | Yamagishi et al. |
| 8,697,343 B2 | 4/2014 | Nakagawa et al. |
| 2002/0058199 A1 | 5/2002 | Zampini et al. |
| 2004/0048190 A1 | 3/2004 | Momota |
| 2004/0048192 A1 | 3/2004 | Shima |
| 2005/0053861 A1 | 3/2005 | Yoneda et al. |
| 2005/0208419 A1 | 9/2005 | Inabe et al. |
| 2005/0250898 A1 | 11/2005 | Maeda et al. |
| 2006/0008736 A1 | 1/2006 | Kanda et al. |
| 2006/0078823 A1 | 4/2006 | Kanda et al. |
| 2006/0246373 A1 | 11/2006 | Wang |
| 2007/0178405 A1 | 8/2007 | Kanda et al. |
| 2007/0269754 A1 | 11/2007 | Fujiwara et al. |
| 2010/0003615 A1 | 1/2010 | Nakamura et al. |
| 2011/0151378 A1 | 6/2011 | Matsumura et al. |

FOREIGN PATENT DOCUMENTS

| | | |
|---|---|---|
| EP | 1621927 | 2/2006 |
| EP | 1720072 | 11/2006 |
| EP | 1736827 | 12/2006 |
| EP | 1754999 | 2/2007 |
| EP | 1811339 | 7/2007 |
| JP | 2005-173474 | 6/2005 |
| JP | 2006-48029 | 2/2006 |
| JP | 2006-309245 | 11/2006 |
| JP | 2007-304537 | 11/2007 |
| WO | WO 2004/068242 | 8/2004 |
| WO | WO 2005/012374 | 2/2005 |
| WO | WO 2005/057288 | 6/2005 |
| WO | WO 2005/085954 | 9/2005 |

OTHER PUBLICATIONS

Extended European Search Report for corresponding EP Application No. 07739535.8-1226, dated May 19, 2011.
Chinese Office Action for corresponding CN Application No. 200780007265.2, dated Aug. 31, 2011 (w/ English translation).
Chinese Office Action for corresponding CN Application No. 201110008725.1, dated Feb. 29, 2012 (w/ English translation).
Chinese Office Action for corresponding CN Application No. 200780007265.2, dated Mar. 7, 2012 (w/ English translation).
European Office Action for corresponding EP Application No. 07739535.8-1226, dated Apr. 16, 2012.
Chinese Office Action for corresponding CN Application No. 200780007265.2, dated Jul. 24, 2012 (w/ English translation).
Chinese Office Action for corresponding CN Application No. 201110008725.1, dated Aug. 27, 2012 (w/ English translation).
Japanese Office Action for corresponding JP Application No. 2008-509732, dated Jan. 8, 2013 (w/ English translation).
Chinese Office Action for corresponding CN Application No. 201110008725.1, dated Apr. 15, 2013 (w/ English translation).
Korean Office Action for corresponding KR Application No. 10-2008-7021203, dated Jun. 2, 2013 (w/ English translation).
Korean Office Action for corresponding KR Application No. 10-2008-7021203, dated Oct. 31, 2013 (w/ English translation).
Chinese Office Action for corresponding CN Application No. 201110008725.1, dated Feb. 24, 2014 (w/ English translation).
Notice of Reasons for Rejection dated Jul. 1, 2014 in Japanese Patent Application No. 2013-047241 (w/ English translation).
Office Action dated Sep. 4, 2014 in European Patent Application No. 07 739 535.8.

\* cited by examiner

FLUORINE-CONTAINING POLYMER, PURIFICATION METHOD, AND RADIATION-SENSITIVE RESIN COMPOSITION

CROSS-REFERENCE TO RELATED APPLICATIONS

The present application is a continuation application of U.S. patent application Ser. No. 15/299,871, filed Oct. 21, 2016, which in turn is a continuation application of U.S. patent application Ser. No. 14/933,641, filed Nov. 5, 2015, which in turn is a continuation application of U.S. patent application Ser. No. 14/178,622, filed Feb. 12, 2014, which in turn is a continuation application of U.S. patent application Ser. No. 12/294,386, filed Jan. 26, 2009, which in turn is a national stage of International Application No. PCT/JP2007/056094, filed Mar. 23, 2007, which claims priority to Japanese Patent Application No. 2006-099889, filed Mar. 31, 2006, Japanese Patent Application No. 2006-165310, filed Jun. 14, 2006, Japanese Patent Application No. 2006-247299, filed Sep. 12, 2006, and Japanese Patent Application No. 2007-010765, filed Jan. 19, 2007. The contents of these applications are incorporated herein by reference in their entirety.

TECHNICAL FIELD

The present invention relates to a novel fluorine-containing polymer which is suitably used in a resist for liquid immersion lithography in which a resist film is exposed to light through a liquid for liquid immersion lithography such as water, a purification method, and a radiation-sensitive resin composition.

BACKGROUND ART

In the field of microfabrication represented by the manufacture of integrated circuit devices, lithographic technology enabling microfabrication with 0.10 µm or less has been demanded in order to increase the degree of integration in recent years. However, microfabrication in a subquarter micron level is said to be very difficult using near ultraviolet rays such as i-lines which are generally used as radiation in a common lithography process. Therefore, in order to enable microfabrication with 0.10 µm or less, use of radiation with a shorter wavelength is being studied. As examples of such short wavelength radiations, bright line spectrum of a mercury lamp, deep ultraviolet rays represented by excimer lasers, X rays, electron beams, and the like can be given. A KrF excimer laser (wavelength: 248 nm) or an ArF excimer laser (wavelength: 193 nm) are given particular attention.

A number of resists (hereinafter referred to as "chemically-amplified resist") utilizing a chemical amplification effect between a component having an acid-dissociable functional group and a component (hereinafter referred to as "acid generator") which generates an acid upon being exposed to radiation (hereinafter referred to as "exposure") have been proposed as a resist suitable for being exposed to such an excimer laser. A chemically-amplified resist has been proposed which comprises a resin having t-butyl ester group of a carboxylic acid or t-butyl carbonate group of phenol and an acid generator. The t-butyl ester group or t-butyl carbonate group in the resin dissociates by the function of an acid generated upon exposure, whereby the resist has an acidic group such as a carboxyl group or a phenolic hydroxyl group. As a result, exposed areas on the resist film become readily soluble in an alkaline developer.

Formation of more minute patterns (a minute resist pattern with a line width of about 45 nm, for example) will be required for such a lithographic process in the future. Reducing the wavelength of a light source of a photolithography instrument and increasing the numerical aperture (NA) of a lens are thought to be means for forming such a pattern with less than 45 nm, as described above. However, an expensive exposure machine is necessary for reducing the wavelength of a light source. In addition, increasing the numerical aperture (NA) of a lens involves a problem of decreasing the depth of focus even if resolution is increased due to a trade-off relationship between the resolution and the depth of focus.

Recently, a liquid immersion lithographic process has been reported as a lithographic technique enabling a solution for such a problem. In the liquid immersion lithographic process, a liquid refractive-index medium (liquid for liquid immersion lithography) such as pure water and a fluorine-containing inert liquid is caused to be present between a lens and a resist film on a substrate while having a specified thickness, at least on the surface of the resist film. In this method, when air or an inert gas such as nitrogen in a light-path is replaced by a liquid having a larger refractive index (n) such as pure water, the resolution can be increased without a decrease in depth of focus by using a light source with a given wavelength to the same degree as in the case in which a light source with a shorter wavelength is used, or the case in which a higher NA lens is used. Since a resist pattern having a higher resolution and excellent depth of focus can be formed at a low cost using the lens mounted on existing apparatuses by utilizing the liquid immersion lithography, the liquid immersion lithography has gotten a great deal of attention.

In the above-mentioned liquid immersion lithographic process, however, an acid generator and the like is eluted from the resist film since the resist film is brought into direct contact with the liquid for liquid immersion lithography such as water during exposure. When a large amount of the components is eluted, the lens may be damaged, a pattern having a prescribed shape may not be obtained, and a sufficient resolution may not be obtained.

Additionally, in the case where water is used as the liquid for liquid immersion lithography, water may not be sufficiently removed during high speed scanning exposure and watermarks may be left, if a receding contact angle between the resist film and water is small.

Resins described in Patent Document 1 and Patent Document 2, and additives described in Patent Document 3 have been proposed as a resin for using in a liquid immersion lithographic apparatus.

However, the receding contact angle between the resist and water is not necessarily sufficient in resists in which these resins and additives are used. A small receding contact angle tends to leave watermarks due to poor water removal during high speed scanning exposure. Moreover, the proposed resists do not necessarily sufficiently suppress elution of an acid generator and the like in water.

[Patent Document 1] WO 2004/068242
[Patent Document 2] JP-A 2005-173474
[Patent Document 3] JP-A 2006-48029

DISCLOSURE OF THE INVENTION

Problems that the Invention is to Solve

An object of the present invention is to provide a novel fluorine-containing polymer, a radiation-sensitive resin composition for liquid immersion lithography which contains the fluorine-containing polymer, which leads to a pattern having an excellent shape and excellent depth of focus, wherein the amount of an eluted component in a liquid for liquid immersion lithography such as water that comes in contact with the resist during exposure in liquid immersion lithography is little, and which provides a larger receding contact angle between the resist film and the liquid for liquid immersion lithography such as water, and a method for purifying the fluorine-containing polymer.

Means for Solving the Problems

The means for attaining the above-mentioned objective are as follows.

[1] A fluorine-containing polymer for use in a radiation-sensitive resin composition which is used for forming a photoresist film in a process of forming a resist pattern, including a liquid immersion lithographic process in which radiation is emitted through a liquid having a refractive index larger than the refractive index of air at a wavelength of 193 nm, and being present between a lens and the photoresist film, characterized in that the fluorine-containing polymer has a weight average molecular weight determined by gel permeation chromatography in the range from 1,000 to 50,000 and a receding contact angle with water and the photoresist film formed therefrom is 70° or more.

[2] The fluorine-containing polymer according to above [1], comprising a repeating unit represented by the following general formula (1),

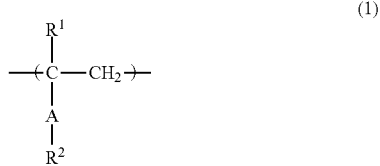

(1)

wherein $R^1$ represents hydrogen atom, methyl group or a trifluoromethyl group, A represents a connecting group, and $R^2$ represents a linear or branched alkyl group having 1 to 6 carbon atoms or a monovalent alicyclic hydrocarbon group having 4 to 20 carbon atoms, each containing at least one fluorine atom, or a derivative thereof.

[3] The fluorine-containing polymer according to above [1] or [2], comprising a repeating unit represented by the following general formula (2),

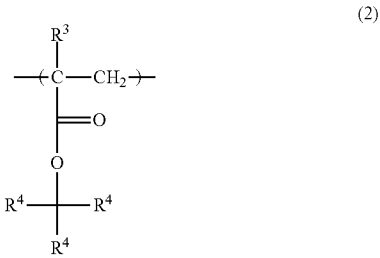

(2)

wherein $R^3$ represents hydrogen atom, methyl group or a trifluoromethyl group, and $R^4$ individually represents a monovalent alicyclic hydrocarbon group having 4 to 20 carbon atoms or a derivative thereof, or a linear or branched alkyl group having 1 to 4 carbon atoms.

[4] A radiation-sensitive resin composition characterized by comprising the fluorine-containing polymer (A) according to any one of Claims [1] to [3], a resin (B) having an acid-unstable group, a radiation-sensitive acid generator (C), a nitrogen-containing compound (D) and a solvent (E).

[5] The radiation-sensitive resin composition according to above [4], wherein the content of the fluorine-containing polymer (A) is 0.1% or more by weight based on 100% by weight of the whole of the radiation-sensitive resin composition.

[6] The radiation-sensitive resin composition according to above [4] or [5], wherein the resin (B) comprises a repeating unit having a lactone structure.

[7] The radiation-sensitive resin composition according to any one of above [4] to [6], wherein the acid-unstable group of the resin (B) has a monocyclic structure or a polycyclic structure.

[8] A method for purifying the fluorine-containing polymer according to any one of above [1] to [3], characterized by contacting a resin solution in which the fluorine-containing polymer is dissolved in the following solvent C with the following solvent A to a homogeneous solution, bringing the resin solution into contact with the following solvent B, and then with water, Solvent A: A hydrocarbon solvent having 5 to 10 carbon atoms Solvent B: An alcoholic solvent having 1 to 10 carbon atoms which is insoluble in solvent A Solvent C: A ketone solvent having 2 to 10 carbon atoms which is soluble in solvent A and solvent B.

Effect of the Invention

When the radiation-sensitive resin composition for liquid immersion lithography comprising the specific fluorine-containing polymer of the present invention is used, a resultant pattern is favorable, depth of focus is excellent, and the amount of components eluted in a liquid with which the resist comes in contact during exposure by liquid immersion lithography can be minimized. Furthermore, the receding contact angle between the resist film and the liquid for liquid immersion lithography can be sufficiently increased to ensure complete removal of water drops during high speed scanning exposure.

EXPLANATION OF SYMBOLS

Figure 1:
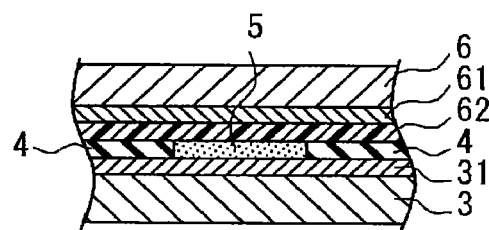
FIG. 1 is a schematic drawing for explanation of the method of preparing a sample for measuring eluted amount.

1; substrate, 2; pattern, 3; silicon wafer, 31; HMDS, 4; silicon rubber sheet, 5; ultra pure water, 6; silicon wafer, 61; anti-reflection film, 62; resist film.

BEST MODE FOR CARRYING OUT THE INVENTION

Hereinafter, the present invention is described in detail.
<Fluorine-Containing Polymer (A)>

The fluorine-containing polymer (A) (hereinafter referred to simply as "polymer (A)") in the present invention is a polymer for formulating into a radiation-sensitive resin composition for forming a resist film in a process of forming a resist pattern, including a liquid immersion lithographic process in which radiation is emitted through a liquid having a refractive index larger than the refractive index of air at a wavelength of 193 nm, and being present between a lens and the resist film, and leads to a receding contact angle between water and the resist film formed therefrom of 70° or more.

The receding contact angle is more preferably 75° or more, still more preferably 80° or more, and particularly preferably 85° or more. The term "receding contact angle" in the present specification refers to a contact angle between a liquid surface and a substrate on which a film of a resin composition containing the polymer (A) is formed, when 25 µL of water is dropped on the substrate and thereafter suctioned at a rate of 10 µL/min. The receding contact angle can be measured using "DSA-10" (manufactured by KRUS) as described later in Examples.

Since the polymer (A) has fluorine sites in the structure, the distribution of the polymer (A) tends to be high near the surface of the resist film formed from the resist composition to which the polymer (A) is added due to the oil repellence of the polymer (A), whereby elution of an acid generator, an acid diffusion controller and the like in the liquid for liquid immersion lithography such as water during exposure can be suppressed. In addition, the receding contact angle between the resist film and the liquid for liquid immersion lithography is increased due to the water repellence of the polymer (A), which ensures high speed scanning exposure without leaving waterdrops. Moreover, if a common upper layer film for liquid immersion lithography is used in combination, not only elution can be further reduced, but also defects such as watermarks which are caused by the liquid for liquid immersion lithography can be suppressed due to high water repellency in the resist.

The polymer (A) according to the present invention is produced by polymerizing at least one monomer having fluorine atom in the structure.

Examples of the monomer having fluorine atom in the structure include a monomer having fluorine atom in the main chain, a monomer having fluorine atom in side chains, and a monomer having fluorine atom in the main chain and side chain.

Examples of the monomer having fluorine atom in the main chain include an α-fluoroacrylate compound, an α-trifluoromethyl acrylate compound, a β-fluoroacrylate compound, a β-trifluoromethyl acrylate compound, an α, β-fluoroacrylate compound, an α, β-trifluoromethyl acrylate compound, a compound in which hydrogen atom on one or more vinyl sites is substituted with fluorine atom, a trifluoromethyl group or the like, and the like.

In addition, examples of the monomer having fluorine atom in the side chain include an alicyclic olefin compound such as norbornene of which the side chain comprises fluorine atom, a fluoroalkyl group or a derivative thereof, an ester compound having a fluoroalkyl group or a derivative thereof of acrylic acid or methacrylic acid, one or more olefins of which the side chain (positions not containing a double bond) is fluorine atom, a fluoroalkyl group or a derivative thereof, and the like.

Examples of the monomer having fluorine atoms in the main chain and side chain include an ester compound having a fluoroalkyl group or a derivative thereof such as α-fluoroacrylic acid, β-fluoroacrylic acid, α,β-fluoroacrylic acid, α-trifluoromethylacrylic acid, β-trifluoromethylacrylic acid and α,β-trifluoromethylacrylic acid; a compound derived by substituting a side chain of a compound in which hydrogen atom on one or more of vinyl site is substituted with fluorine atom, trifluoromethyl group or the like, with fluorine atom, a fluoroalkyl group or a derivative thereof; a compound derived by replacing hydrogen atom bonded to a double bond of one or more alicyclic olefin compounds with fluorine atom, trifluoromethyl group or the like, and of which the side chain is a fluoroalkyl group or a derivative thereof; and the like. The term "alicyclic olefin compound" refers to a compound having a double bond in the ring.

Although the repeating unit providing the polymer (A) having fluorine atom is not particularly limited as mentioned above, the repeating unit represented by the following general formula (1) (hereinafter referred to as "repeating unit (1)") is preferably used as a fluorine-imparting repeating unit.

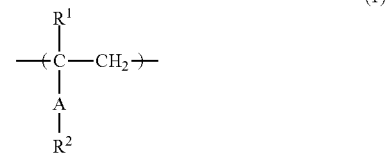

(1)

[In the general formula (1), $R^1$ represents hydrogen atom, methyl group or a trifluoromethyl group, A represents a connecting group, and $R^2$ represents a linear or branched alkyl group having 1 to 6 carbon atoms or a monovalent alicyclic hydrocarbon group having 4 to 20 carbon atoms, each containing at least one fluorine atom, or a derivative thereof.]

A in the general formula (1) represents a connecting group and examples thereof include a single bond, an oxygen atom, a sulfur atom, a carbonyloxy group, an oxycarbonyl group, an amide group, a sulfonylamide group, a urethane group and the like.

Examples of the linear or branched alkyl group having 1 to 6 carbon atoms containing at least one fluorine atom represented by $R^2$ in the general formula (1) include a partially fluorinated linear or branched alkyl group such as methyl group, ethyl group, 1-propyl group, 2-propyl group, 1-butyl group, 2-butyl group, 2-(2-methylpropyl) group, 1-pentyl group, 2-pentyl group, 3-pentyl group, 1-(2-methylbutyl) group, 1-(3-methylbutyl) group, 2-(2-methylbutyl) group, 2-(3-methylbutyl) group, neopentyl group, 1-hexyl group, 2-hexyl group, 3-hexyl group, 1-(2-methylpentyl) group, 1-(3-methylpentyl) group, 1-(4-methylpentyl) group, 2-(2-methylpentyl) group, 2-(3-methylpentyl) group, 2-(4-methylpentyl) group, 3-(2-methylpentyl) group and 3-(3-methylpentyl) group, a perfluoroalkyl group and the like.

In addition, examples of the monovalent alicyclic hydrocarbon group having 4 to 20 carbon atoms containing at least one fluorine atom or a derivative thereof represented by $R^2$ in the general formula (1) include a partially fluorinated alicyclic alkyl group such as cyclopentyl group, cyclopentylmethyl group, 1-(1-cyclopentylethyl) group, 1-(2-cyclopentylethyl) group, cyclohexyl group, cyclohexylmethyl group, 1-(1-cyclohexylethyl) group, 1-(2-cyclohexylethyl) group, cycloheptyl group, cycloheptylmethyl group, 1-(1-cycloheptylethyl) group, 1-(2-cycloheptylethyl) group, and 2-norbornyl group, a perfluoroalkyl group and the like.

Preferable examples of the monomer which leads to the repeating unit (1) include trifluoromethyl (meth)acrylate, 2,2,2-trifluoroethyl (meth)acrylate, perfluoroethyl (meth)acrylate, perfluoro-n-propyl (meth)acrylate, perfluoro-i-propyl (meth)acrylate, perfluoro-n-butyl (meth)acrylate, perfluoro-i-butyl (meth)acrylate, perfluoro t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl) (meth)acrylate, 1-(5-trifluoromethyl-3,3,4,4,5,6,6,6-octafluorohexyl) (meth)acrylate and the like.

The above-mentioned polymer (A) may have one or more of these repeating units (1).

The content of the repeating unit (1) is usually 5 mol % or more, preferably 10 mol % or more, and more preferably 15 mol % or more based on 100 mol % of the total amount of the repeating units in the polymer (A). If the content of the repeating unit (1) is less than 5 mol %, a receding contact angle at 70° or more may not be achieved and elution of an acid generator and the like from a resist film may not be suppressed.

The polymer (A) according to the present invention preferably further comprises at least one repeating unit represented by the following general formula (2) (hereinafter referred to as "repeating unit (2)"). Inclusion of the repeating unit (2) ensures a high receding contact angle during exposure and increases solubility in alkaline during development. Specifically, the polymer (A) maintains the structure of the general formula (2) during exposure, ensuring a high receding contact angle without an almost no loss of the effect of the monomer having fluorine atom in its structure, and thereafter releases —C(R$^4$)$_3$ group from the structure of the general formula (2), whereupon the solubility of the polymer in alkaline is improved.

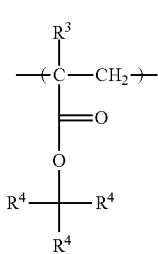

(2)

[In the general formula (2), R$^3$ represents hydrogen atom, methyl group or a trifluoromethyl group, and R$^4$ individually represents a monovalent alicyclic hydrocarbon group having 4 to 20 carbon atoms or a derivative thereof, or a linear or branched alkyl group having 1 to 4 carbon atoms.]

Examples of the monovalent alicyclic hydrocarbon group having 4 to 20 carbon atoms represented by R$^4$ in the general formula (2) include a group comprising an alicyclic ring originated from a cycloalkane such as norbornane, tricyclodecane, tetracyclododecane, adamantane, cyclobutane, cyclopentane, cyclohexane, cycloheptane and cyclooctane; and a group obtained by substituting the alicyclic ring with one or more linear, branched or cyclic alkyl groups having 1 to 4 carbon atoms such as methyl group, ethyl group, n-propyl group, i-propyl group, n-butyl group, 2-methylpropyl group, 1-methylpropyl group and t-butyl group; and the like. Two R$^4$s may form a divalent alicyclic hydrocarbon group or a derivative thereof in combination of the carbon atoms to which these two groups bond.

Among these alicyclic hydrocarbon groups, a group comprising an alicyclic ring originated from an alicyclic group originated from norbornane, tricyclodecane, tetracyclododecane, adamantane, cyclopentane or cyclohexane, a group in which a group comprising the alicyclic ring is substituted with the above alkyl groups, and the like are preferable.

Additionally, examples of the linear or branched alkyl group having 1 to 4 carbon atoms represented by R$^4$ in the general formula (2) include methyl group, ethyl group, n-propyl group, i-propyl group, n-butyl group, 2-methylpropyl group, 1-methylpropyl group, t-butyl group and the like.

Preferable examples of the —C(R$^4$)$_3$ in the general formula (2) include t-butyl group, 1-n-(1-ethyl-1-methyl)propyl group, 1-n-(1,1-dimethyl)propyl group, 1-n-(1,1-dimethyl)butyl group, 1-n-(1,1-dimethyl)pentyl group, 1-(1,1-diethyl)propyl group, 1-n-(1,1-diethyl)butyl group, 1-n-(1,1-diethyl)pentyl group, 1-(1-methyl)cyclopentyl group, 1-(1-ethyl)cyclopentyl group, 1-(1-n-propyl)cyclopentyl group, 1-(1-i-propyl)cyclopentyl group, 1-(1-methyl)cyclohexyl group, 1-(1-ethyl)cyclohexyl group, 1-(1-n-propyl)cyclohexyl group, 1-(1-i-propyl)cyclohexyl group, 1-{1-methyl-1-(2-norbornyl)}ethyl group, 1-{1-methyl-1-(2-tetracyclodecanyl)}ethyl group, 1-{1-methyl-1-(1-adamantyl)}ethyl group, 2-(2-methyl)norbornyl group, 2-(2-ethyl)norbornyl group, 2-(2-n-propyl)norbornyl group, 2-(2-i-propyl)norbornyl group, 2-(2-methyl)tetracyclodecanyl group, 2-(2-ethyl)tetracyclodecanyl group, 2-(2-n-propyl)tetracyclodecanyl group, 2-(2-i-propyl)tetracyclodecanyl group, 1-(1-methyl)adamantyl group, 1-(1-ethyl)adamantyl group, 1-(1-n-propyl)adamantyl group and 1-(1-i-propyl)adamantyl group; a group obtained by substituting an alicyclic group with one or more linear, branched or cyclic alkyl groups having 1 to 4 carbon atoms such as methyl group, ethyl group, n-propyl group, i-propyl group, n-butyl group, 2-methylpropyl group, 1-methylpropyl group and t-butyl group; and the like.

Preferable examples of the monomer which leads to the repeating unit (2) include 2-methyladamantyl-2-yl (meth)acrylate, 2-methyl-3-hydroxyadamantyl-2-yl (meth)acrylate, 2-ethyladamantyl-2-yl (meth)acrylate, 2-ethyl-3-hydroxyadamantyl-2-yl (meth)acrylate, 2-n-propyladamantyl-2-yl (meth)acrylate, 2-isopropyladamantyl-2-yl (meth)acrylate, 2-methylbicyclo[2.2.1]hept-2-yl (meth)acrylate, 2-ethylbicyclo[2.2.1]hept-2-yl (meth)acrylate, 8-methyltricyclo[5.2.1.0$^{2,6}$]decan-8-yl (meth)acrylate, 8-ethyltricyclo[5.2.1.0$^{2,6}$]decan-8-yl (meth)acrylate, 4-methyltetracyclo[6.2.1$^{3,6}$.0$^{2,7}$]dodecan-4-yl (meth)acrylate, 4-ethyltetracyclo[6.2.1$^{3,6}$.0$^{2,7}$]dodecan-4-yl (meth)acrylate, 1-(bicyclo[2.2.1]hept-2-yl)-1-methylethyl (meth)acrylate, 1-(tricyclo[5.2.1.0$^{2,6}$]decan-8-yl)-1-methylethyl (meth)acrylate, 1-(tetracyclo[6.2.1$^{3,6}$.0$^{2,7}$]dodecan-4-yl)-1-methylethyl (meth)acrylate, 1-(adamantan-1-yl)-1-methylethyl (meth)acrylate, 1-(3-hydroxyadamantan-1-yl)-1-methylethyl (meth)acrylate, 1,1-dicyclohexylethyl (meth)acrylate, 1,1-di(bicyclo[2.2.1]hept-2-yl)ethyl (meth)acrylate, 1,1-di(tricyclo[5.2.1.0$^{2,6}$]decan-8-yl)ethyl (meth)acrylate, 1,1-di(tetracyclo[6.2.1$^{3,6}$.0$^{2,7}$]dodecan-4-yl)ethyl (meth)acrylate, 1,1-di(adamantan-1-yl)ethyl (meth)acrylate, 1-methyl-1-cyclopentyl (meth)acrylate, 1-ethyl-1-cyclopentyl (meth)acrylate, 1-methyl-1-cyclohexyl (meth)acrylate, 1-ethyl-1-cyclohexyl (meth)acrylate and the like.

Of these monomers, 2-methyladamantyl-2-yl (meth)acrylate, 2-ethyladamantyl-2-yl (meth)acrylate, 2-methylbicyclo[2.2.1]hept-2-yl (meth)acrylate, 2-ethylbicyclo[2.2.1]hept-2-yl (meth)acrylate, 1-(bicyclo[2.2.1]hept-2-yl)-1-methylethyl (meth)acrylate, 1-(adamantan-1-yl)-1-methylethyl (meth)acrylate, 1-methyl-1-cyclopentyl (meth)acrylate, 1-ethyl-1-cyclopentyl (meth)acrylate, 1-methyl-1-cyclohexyl (meth)acrylate, 1-ethyl-1-cyclohexyl (meth)acrylate and the like are particularly preferred.

The above-mentioned polymer (A) may have one or more of these repeating units (2).

The content of the repeating unit (2) is usually 95 mol % or less, preferably 10 mol % to 90 mol %, and more preferably 10 mol % to 85 mol % based on 100 mol % of the total amount of the repeating units in the polymer (A). If the content of the repeating unit (2) is more than 95 mol %, a receding contact angle at 70° or more may not be achieved and elution of an acid generator and the like from a resist film may not be suppressed.

The polymer (A) may comprise one or more of "other repeating unit" such as a repeating unit having a lactone skeleton, hydroxyl group and carboxyl group to improve alkali solubility, a repeating unit originating from an alicyclic compound and a repeating unit originating from an aromatic compound to improve etching resistance, and a repeating unit originating from an aromatic compound to suppress reflection at a substrate, in addition to the above-mentioned repeating unit having fluorine atom in the structure and the repeating unit (2).

Examples of a monomer which leads to a repeating unit having a lactone skeleton (hereinafter referred to as "repeating unit (3)") include the following compound represented by the general formulas (3-1) to (3-6), and the like.

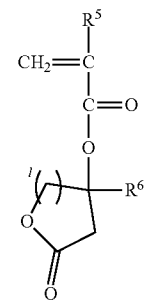

(3-1)

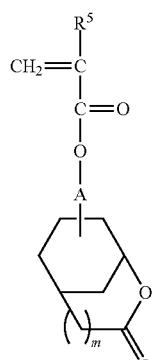

(3-2)

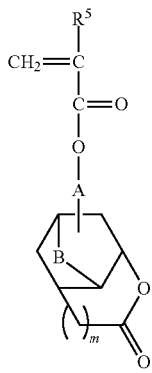

(3-3)

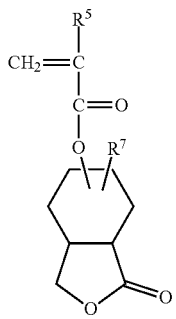

(3-4)

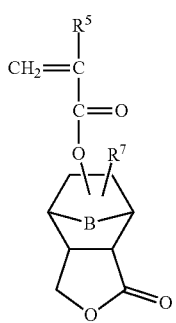

(3-5)

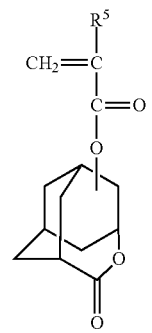

(3-6)

In the general formulas (3-1) to (3-6), $R^5$ represents hydrogen atom or methyl group, $R^6$ represents an alkyl group having 1 to 4 carbon atoms, that may be substituted, and $R^7$ represents hydrogen atom or methoxy group. Additionally, A represents a single bond or methylene group, B represents oxygen atom or methylene group. Further, l is an integer of 1 to 3, and m is 0 or 1.

Examples of the alkyl group having 1 to 4 carbon atoms that may be substituted as $R^6$ in the general formula (3-1) include methyl group, ethyl group, n-propyl group, i-propyl group, n-butyl group, 2-methylpropyl group, 1-methylpropyl group, t-butyl group and the like.

Preferable examples of the monomer which leads to the repeating unit (3) include 5-oxo-4-oxa-tricyclo[4.2.1.0$^{3,7}$]non-2-yl (meth)acrylate, 9-methoxycarbonyl-5-oxo-4-oxa-tricyclo[4.2.1.0$^{3,7}$]non-2-yl (meth)acrylate, 5-oxo-4-oxa-tricyclo[5.2.1.0$^{3,8}$]dec-2-yl (meth)acrylate, 10-methoxycarbonyl-5-oxo-4-oxa-tricyclo[5.2.1.0$^{3,8}$]non-2-yl (meth)acrylate, 6-oxo-7-oxa-bicyclo[3.2.1]oct-2-yl (meth)acrylate, 4-methoxycarbonyl-6-oxo-7-oxa-bicyclo[3.2.1]oct-2-yl (meth)acrylate, 7-oxo-8-oxa-bicyclo[3.3.1]oct-2-yl (meth)acrylate, 4-methoxycarbonyl-7-oxo-8-oxa-bicyclo[3.3.1]oct-2-yl (meth)acrylate, 2-oxotetrahydropyran-4-yl (meth)acrylate, 4-methyl-2-oxotetrahydropyran-4-yl (meth)acrylate, 4-ethyl-2-oxotetrahydropyran-4-yl (meth)acrylate, 4-propyl-2-oxotetrahydropyran-4-yl (meth)acrylate, 5-oxotetrahydrofuran-3-yl (meth)acrylate, 2,2-dimethyl-5-oxotetrahydrofuran-3-yl (meth)acrylate, 4,4-dimethyl-5-oxotetrahydrofuran-3-yl (meth)acrylate, 2-oxotetrahydrofuran-3-yl (meth)acrylate, 4,4-dimethyl-2-oxotetrahydrofuran-3-yl (meth)acrylate, 5,5-dimethyl-2-oxotetrahydrofuran-3-yl (meth)acrylate, 2-oxotetrahydrofuran-3-yl (meth)acrylate, 5-oxotetrahydrofuran-2-yl methyl (meth)acrylate, 3,3-dimethyl-5-oxotetrahydrofuran-2-yl methyl (meth)acrylate, 4,4-dimethyl-5-oxotetrahydrofuran 2-yl methyl (meth)acrylate and the like.

Examples of the repeating unit containing an alicyclic compound (hereinafter referred to as "repeating unit (4)") include a repeating unit represented by the following general formula (4) and the like.

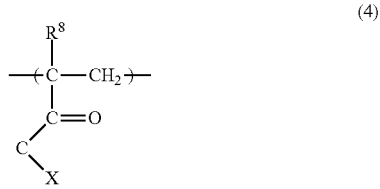

(4)

[In the general formula (4), R$^8$ represents hydrogen atom, methyl group or a trifluoromethyl group, and X represents an alicyclic hydrocarbon group having 4 to 20 carbon atoms.]

Examples of the alicyclic hydrocarbon group having 4 to 20 carbon atoms as X in the general formula (4) include a hydrocarbon group containing an alicyclic ring originating from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane and tricycle[3.3.1.1$^{3,7}$]decane can be given.

These alicyclic rings originating from the cycloalkane may be substituted with one or more linear, branched or cyclic alkyl groups having 1 to 4 carbon atoms such as methyl group, ethyl group, n-propyl group, i-propyl group, n-butyl group, 2-methylpropyl group, 1-methylpropyl group and a t-butyl group. These are not limited to ones substituted with the above alkyl groups and may be substituted with hydroxyl group, cyano group, a hydroxyalkyl group having 1 to 10 carbon atoms, carboxyl group or oxygen atom.

Preferable examples of the monomer which leads to the repeating unit (4), bicyclo[2.2.1]hept-2-yl (meth)acrylate, bicyclo[2.2.2]oct-2-yl (meth)acrylate, tricyclo[5.2.1.0$^{2,6}$]dec-7-yl (meth)acrylate, tetracyclo[6.2.1.1$^{3,6}$.0$^{2,7}$]dodec-9-yl (meth)acrylate, tricyclo[3.3.1.1$^{3,7}$]dec-1-yl (meth)acrylate, tricyclo[3.3.1.1$^{3,7}$]dec-2-yl (meth)acrylate and the like.

Preferable examples of the monomer which leads to a repeating unit originating from an aromatic compound (hereinafter referred to as "repeating unit (5)") include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-α-methylstyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl (meth)acrylate, benzyl (meth)acrylate, acenaphthylene, 5-hydroxyacenaphthylene, 1-vinylnaphthalene, 2-vinylnaphthalene, 2-hydroxy-6-vinylnaphthalene, 1-naphthyl (meth)acrylate, 2-naphthyl (meth)acrylate, 1-naphthylmethyl (meth)acrylate, 1-anthryl (meth)acrylate, 2-anthryl (meth)acrylate, 9-anthryl (meth)acrylate, 9-anthrylmethyl (meth)acrylate, 1-vinylpyrene and the like.

Either one type or two or more types of the "other repeating unit" represented by the repeating units (3) (4), and (5) may be included in the polymer (A) according to the present invention.

The content of the other repeating unit is usually 70 mol % or less, preferably 65 mol % or less, and more preferably 60 mol % or less of the total amount of the repeating units in the polymer (A). If the content of the other repeating unit is more than 70 mol %, a receding contact angle at 700 or more may not be achieved and elution of an acid generator and the like from a resist film may not be suppressed.

The fluorine-containing polymer (A) according to the present invention can be produced by polymerizing polymerizable unsaturated monomers corresponding to each repeating unit in the presence of a chain transfer agent as required, using a radical polymerization initiator such as a hydroperoxide, a dialkyl peroxide, a diacyl peroxide, and an azo compound in an appropriate solvent.

Examples of the solvent used for polymerization include an alkane such as n-pentane, n-hexane, n-heptane, n-octane, n-nonane and n-decane; a cycloalkane such as cyclohexane, cycloheptane, cyclooctane, decalin and norbornane; an aromatic hydrocarbon such as benzene, toluene, xylene, ethylbenzene and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate and methyl propionate; a ketone such as 2-butanone, 4-methyl-2-pentanone and 2-heptanone; an ether such as tetrahydrofuran, dimethoxyethanes and diethoxyethanes; an alcohol such as methanol, ethanol, 1-propanol, 2-propanol and 4-methyl-2-pentanol; and the like. These solvents may be used singly or in combination of two or more thereof.

The polymerization temperature is usually in the range from 40° C. to 150° C., and preferably from 50° C. to 120° C. The reaction time is usually in the range from 1 to 48 hours, and preferably from 1 to 24 hours.

Additionally, the polystyrene-reduced weight average molecular weight determined by gel permeation chromatography (GPC) (hereinafter referred to as "Mw") of the fluorine-containing polymer (A) according to the present invention is in the range from 1,000 to 50,000, preferably 1,000 to 40,000, and more preferably 1,000 to 30,000. If the Mw of the polymer (A) is less than 1,000, a sufficient receding contact angle cannot be obtained. On the other hand, if the Mw is more than 50,000, developability in a resist tends to be decreased.

The ratio (Mw/Mn) of the Mw to the polystyrene-reduced number average molecular weight of the polymer (A) (referred to as "Mn") is normally in the range from 1 to 5, and preferably 1 to 4.

In the polymer (A), the solids content of the low molecular weight components originating from monomers used for preparing the polymer (A) is preferably 0.1% or less by weight, more preferably 0.07% or less by weight, and still more preferably 0.05% or less by weight based on 100% by weight of the polymer. If the content is less than 0.1% by weight, the eluted amount in the liquid for liquid immersion lithography such as water with which the resist film comes in contact during exposure can be reduced. In addition, it is possible to prevent generation of extraneous substances in the resist during storage, inhibit uneven resist application, and sufficiently suppress defects during pattern formation.

Examples of the above-mentioned low molecular weight components originating from the monomers include a monomer, a dimer, a trimer and an oligomer, and they may be ones having Mw of 500 or less. The component having Mw of 500 or less can be removed by the purification method to be described. The amount of the low molecular weight components can be determined by analysis of the resin using high performance liquid chromatography (HPLC).

It is preferable that the polymer (A) contain almost no impurities comprising halogens or metals. That can provide a resist leading to improved sensitivity, resolution, process stability, pattern shape and the like.

The polymer (A) can be purified by a chemical purification method such as washing with water and liquid-liquid extraction, a combination of the chemical purification method and a physical purification method such as ultrafiltration and centrifugation, or the like. Among the chemical purification methods, liquid-liquid extraction is particularly preferred.

When the fluorine-containing polymer is purified by the liquid-liquid extraction, it is preferable that a resin solution (copolymer solution) in which the fluorine-containing polymer is dissolved in the following solvent C and the following solvent A are subjected to contact to a homogeneous solution, the mixture is allowed to contact with the following solvent B, and then with water.

Solvent A: A hydrocarbon solvent having 5 to 10 carbon atoms

Solvent B: An alcoholic solvent having 1 to 10 carbon atoms which is insoluble in solvent A Solvent C: A ketone solvent having 2 to 10 carbon atoms which is soluble in solvent A and solvent B Examples of the solvent A (hydrocarbon solvent having 5 to 10 carbon atoms) include an alkane such as n-pentane, n-hexane, n-heptane, n-octane, n-nonane and n-decane. Among these, n-hexane and n-heptane are preferable. These solvents may be used singly or in combination of two or more thereof.

Examples of the solvent B (alcoholic solvent having 1 to 10 carbon atoms which is insoluble in solvent A) include an alcohol such as methanol, ethanol, 1-propanol, 2-propanol and 4-methyl-2-pentanol. Among these, methanol and ethanol are preferable. These solvents may be used singly or in combination of two or more thereof.

Examples of the solvent C (ketone solvent having 2 to 10 carbon atoms which is soluble in solvent A and solvent B) include a ketone such as acetone, 2-butanone, 4-methyl-2-pentanone and 2-heptanone. Among these, acetone and 2-butanone are preferable. These solvents may be used singly or in combination of two or more thereof.

Preferable combination of the solvent A to C is one of at least one of n-hexane and n-heptane (solvent A), at least one of methanol and ethanol (solvent B), and at least one of acetone and 2-butaneone (solvent C).

<Radiation-Sensitive Resin Composition>

The radiation-sensitive resin composition of the present invention is used for forming a photoresist film in a process of forming a resist pattern, including a liquid immersion lithographic process in which radiation is emitted through a liquid having a refractive index larger than the refractive index of air at a wavelength of 193 nm, and being present between a lens and the photoresist film, and is characterized in that the radiation-sensitive resin composition for formation of the photoresist film comprises the above-mentioned fluorine-containing polymer (A), a resin (B) having an acid-unstable group, a radiation-sensitive acid generator (C), a nitrogen-containing compound (D) and a solvent (E).

In the present invention, the above-mentioned polymer (A) may be used singly or in combination of two or more thereof.

The polymer (A) may be used as an additive for a resist in the present invention. From the viewpoint of ensuring the resist film to secure a sufficient receding contact angle and sufficiently suppressing elution of acid generators from the resist film, the content of the polymer (A) is usually 0.1% or more by weight, preferably 0.1% to 40% by weight, and more preferably 0.5% to 35% by weight based on 100% by weight of the radiation-sensitive resin composition of the present invention. If the content of the polymer (A) is less than 0.1% by weight, effects based on the polymer (A) (high receding contact angle and low elution) are not exhibited, that is, the receding contact angle in the resist film may be lowered or elution of an acid generator and the like from the resist film may not be suppressed. On the other hand, if the content is more than 40% by weight, there is a possibility that the depth of focus of an isolated line may be small or a development defect may occur.

<Resin (B) Having Acid-Unstable Group>

The resin (B) having an acid-unstable group (hereinafter referred to simply as "resin (B)") according to the present invention is not particularly limited because the radiation-sensitive resin composition of the present invention exhibits effects based on the polymer (A) (high receding contact angle and low elution), however, an alkali-insoluble or scarcely alkali-soluble resin is preferable which exhibits alkali-solubility by the function of an acid. The term "alkali-insoluble" and "scarcely alkali-soluble" used herein indicate the following properties: in the case of developing a film using only the resin (B) instead of a resist film formed using the radiation-sensitive resin composition containing the polymer (B) under alkaline development conditions employed for forming a resist pattern on the resist film, 50% or more of the initial thickness of the resist film remains after development.

Examples of the resin (B) include a resin having an alicyclic skeleton such as norbornane ring in the main chain obtained by polymerization of a norbornene derivative and the like, a resin having a norbornane ring and a maleic anhydride derivative in the main chain obtained by copolymerization of a norbornene derivative and maleic anhydride, a resin having a norbornane ring and a (meth)acrylic skeleton in the main chain obtained by copolymerization of a norbornene derivative and a (meth)acrylic compound, a resin having a norbornane ring, a maleic anhydride derivative and a (meth)acrylic skeleton in the main chain obtained by copolymerization of a norbornene derivative, a maleic anhydride and a (meth)acrylic compound, a resin having a (meth)acrylic skeleton in the main chain obtained by copolymerization a (meth)acrylic compound, and the like. The term "(meth)acryl" means "acryl" or "methacryl", or both.

Among the resins (B), a resin having the above-mentioned repeating unit (3) comprising a lactone skeleton is preferable. The same monomers mentioned above can be given as examples of preferable monomers providing the repeating unit (3).

The resin (B) may comprise only one repeating unit (3) or two or more types thereof.

The content of the repeating unit (3) is preferably 5 mol % to 85 mol %, more preferably 10 mol % to 70 mol %, and further preferably 15 mol % to 60 mol % based on 100 mol % of the total of the repeating units in the polymer (B). If the content of the repeating unit (3) is less than 5 mol %, developability and exposure allowance tend to be impaired. If the content exceeds 85 mol %, solubility of the resin (B) in a solvent and resolution tend to be impaired.

Moreover, the resin (B) preferably comprises the repeating unit (2) represented by the above-mentioned general formula (2) in addition to the repeating unit (3). A monomer providing the repeating unit (2) is the same as one mentioned above and is particularly preferably a monomer having a monocyclic structure or a polycyclic structure.

The resin (B) may comprise only one repeating unit (2) or two or more types thereof.

The content of the repeating unit (2) is usually 10 mol % to 70 mol %, preferably 15 mol % to 60 mol %, and further preferably 20 mol % to 50 mol % based on 100 mol % of the total of the repeating units in the polymer (B). If the content of the repeating unit (2) is less than 10 mol %, resolution in a resist may be decreased. If the content is more than 70 mol %, developability and exposure allowance may be impaired.

The resin (B) according to the present invention may comprise one or more of repeating unit other than the repeating units (2) and (3) (hereinafter referred to as "further repeating unit").

The further repeating unit preferably contains at least one repeating unit selected from the above-mentioned repeating unit (4) having an alicyclic compound, the above-mentioned repeating unit (5) originating from an aromatic compound, the following repeating unit represented by the general formula (5) (hereinafter referred to as "repeating unit (6)"), and the following repeating unit represented by the general formula (6) (hereinafter referred to as "repeating unit (7)"). The same monomers mentioned above can be given as examples of preferable monomers providing the repeating units (4) and (5).

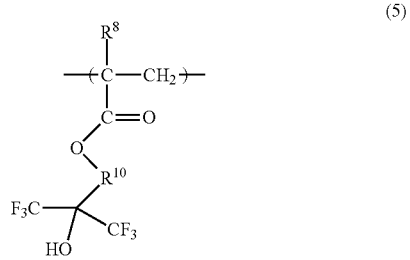

(5)

[In the general formula (5), $R^9$ represents hydrogen atom, an alkyl group having 1 to 4 carbon atoms, a trifluoromethyl group or a hydroxymethyl group, and $R^{10}$ represents a divalent organic group.]

Examples of the alkyl group having 1 to 4 carbon atoms represented by $R^9$ in the general formula (5) include an alkyl group such as methyl group, ethyl group, n-propyl group, i-propyl group, n-butyl group, 2-methylpropyl group, 1-methylpropyl group and t-butyl group.

In addition, the divalent organic group represented by $R^{10}$ in the general formula (5) is preferably a divalent hydrocarbon group. Among the divalent hydrocarbon group, a linear or cyclic hydrocarbon group is preferable. And it may be an alkylene glycol group or an alkylene ester group.

Preferable examples of $R^{10}$ include a saturated chain hydrocarbon group such as methylene group, ethylene group, propylene groups including 1,3-propylene group and 1,2-propylene group, tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group and 2-propylidene group; a monocyclic hydrocarbon group such as a cycloalkylene group having 3 to 10 carbon atoms including cyclobutylene groups (e.g. 1,3-cyclobutylene group), cyclopentylene groups (e.g. 1,3-cyclopentylene group), cyclohexylene groups (e.g. 1,4-cyclohexylene group) and cyclooctylene groups (e.g. 1,5-cyclooctylene group); a bridged cyclic hydrocarbon group such as a cyclic hydrocarbon group with 2 to 4 rings having 4 to 30 carbon atoms including norbornylene groups (e.g. 1,4-norbornylene group and 2,5-norbornylene group), and admantylene groups (e.g. 1,5-admantylene group and 2,6-admantylene group); and the like.

In the case where $R^{10}$ comprises a divalent alicyclic hydrocarbon group in particular, it is preferable to insert an alkylene group having 1 to 4 carbon atoms as a spacer between bis(trifluoromethyl)hydroxymethyl group and the alicyclic hydrocarbon group.

Additionally, $R^{10}$ is preferably a hydrocarbon group containing 2,5-norbornylene group, 1,2-ethylene group and a propylene group.

As particularly preferable examples of the monomer which leads to the repeating unit (6), (1,1,1-trifluoro-2-trifluoromethyl-2-hydroxy-3-propyl) (meth)acrylate, (1,1,1-trifluoro-2-trifluoromethyl-2-hydroxy-4-butyl) (meth)acrylate, (1,1,1-trifluoro-2-trifluoromethyl-2-hydroxy-5-pentyl) (meth)acrylate, (1,1,1-trifluoro-2-trifluoromethyl-2-hydroxy-4-pentyl) (meth)acrylate, 2-{[5-(1',1',1'-trifluoro-2'-trifluoromethyl-2'-hydroxy)propyl]bicyclo[2.2.1]heptyl} (meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl} (meth)acrylate, and the like can be given.

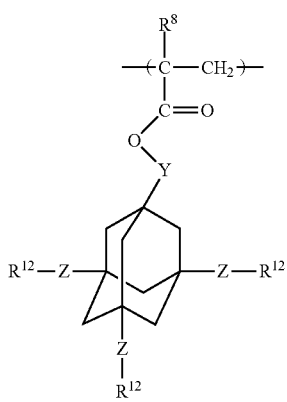

(6)

[In the general formula (6), $R^{11}$ represents hydrogen atom or methyl group, Y represents a single bond or a divalent organic group having 1 to 3 carbon atoms, Z individually represents a single bond or a divalent organic group having 1 to 3 carbon atoms, $R^{12}$ individually represents hydrogen atom, a hydroxyl group, a cyano group, or a COOR$^{13}$ group.]

Examples of the divalent organic group having 1 to 3 carbon atoms represented by Y and Z include methylene group, ethylene group and propylene group.

Additionally, $R^{13}$ in the COOR$^{13}$ group represented by $R^{12}$ in the general formula (6) represents hydrogen atom, a linear or branched alkyl group having 1 to 4 carbon atoms, or an alicyclic alkyl group having 3 to 20 carbon atoms. Examples of the linear or branched alkyl group having 1 to 4 carbon atoms represented by $R^{13}$ include methyl group, ethyl group, n-propyl group, i-propyl group, n-butyl group, 2-methylpropyl group, 1-methylpropyl group, and t-butyl group.

Examples of the alicyclic alkyl group having 3 to 20 carbon atoms include a cycloalkyl group represented by —$C_nH_{2n-1}$ (wherein n is an integer of 3 to 20) such as cyclopropyl group, cyclobutyl group, cyclopentyl group, cyclohexyl group, cycloheptyl group and cyclooctyl group. Further, a polyalicyclic alkyl group such as bicyclo[2.2.1]heptyl group, tricyclo[5.2.1.0$^{2,6}$]decyl group, tetracyclo[6.2.1.1$^{3,6}$.0$^{2,7}$]dodecanyl group and adamantyl group; a group in which a part of a cycloalkyl group or a polyalicyclic alkyl group is substituted with one or more linear, branched or cyclic alkyl group; and the like can be given.

When at least one of three $R^{12}$s is not hydrogen atom and Y is a single bond, at least one of three Zs is preferably a divalent organic group having 1 to 3 carbon atoms.

Preferable examples of the monomer which leads to the repeating unit (7) include, 3-hydroxyadamantan-1-yl-methyl (meth)acrylate, 3,5-dihydroxyadamantan-1-yl-methyl (meth)acrylate, 3-hydroxy-5-cyanoadamantan-1-yl-methyl (meth)acrylate, 3-hydroxy-5-carboxyladamantan-1-yl-methyl (meth)acrylate, 3-hydroxy-5-methoxycarbonyladamantan-1-yl-methyl (meth)acrylate, 3-hydroxymethyladamantan-1-yl-methyl (meth)acrylate, 3,5-dihydroxymethyladamantan-1-yl-methyl (meth)acrylate, 3-hydroxy-5-hydroxymethyladamantan-1-yl-methyl (meth)acrylate, 3-cyano-5-hydroxymethyladamantan-1-yl-methyl (meth)acrylate, 3-hydroxymethyl-5-carboxyladamantan-1-yl-methyl (meth)acrylate, 3-hydroxymethyl-5-methoxycarbonyladamantan-1-yl-methyl (meth)acrylate, 3-cyanoadamantane-1-yl-methyl (meth)acrylate, 3,5-dicyanoadamantan-1-yl-methyl (meth)acrylate, 3-cyano-5-carboxyladamantan-1-yl-methyl (meth)acrylate, 3-cyano-5-methoxycarbonyladamantan-1-yl-methyl (meth)acrylate, 3-carboxyladamantan-1-yl-methyl (meth)acrylate, 3,5-dicarboxyladamantan-1-yl-methyl (meth)acrylate, 3-carboxyl-5-methoxycarbonyladamantan-1-yl-methyl (meth)acrylate, 3-methoxycarbonyladamantan-1-yl-methyl (meth)acrylate, 3,5-dimethoxycarbonyladamantan-1-yl-methyl (meth)acrylate, 3-hydroxy-5-methyladamantan-1-yl (meth)acrylate, 3,5-dihydroxy-7-methyladamantan-1-yl (meth)acrylate, 3-hydroxy-5-cyano-7-methyladamantan-1-yl (meth)acrylate, 3-hydroxy-5-carboxyl-7-methyladamantan-1-yl (meth)acrylate, 3-hydroxy-5-methoxycarbonyl-7-methyladamantan-1-yl (meth)acrylate, 3-hydroxymethyl-5-methyladamantan-1-yl (meth)acrylate, 3,5-dihydroxymethyl-7-methyladamantan-1-yl (meth)acrylate, 3-hydroxy-5-hydroxymethyl-7-methyladamantan-1-yl (meth)acrylate, 3-cyano-5-hydroxymethyl-7-methyladamantan-1-yl (meth)acrylate, 3-hydroxymethyl-5-carboxyl-7-methyladamantan-1-yl (meth)acrylate, 3-hydroxymethyl-5-methoxycarbonyl-7-methyladamantan-1-yl (meth)acrylate, 3-cyano-5-methyladamantan-1-yl (meth)acrylate, 3,5-dicyano-7-methyladamantan-1-yl (meth)acrylate, 3-cyano-5-carboxyl-7-methyladamantan-1-yl (meth)acrylate, 3-cyano-5-methoxycarbonyl-7-methyladamantan-1-yl (meth)acrylate, 3-carboxyl-5-methyladamantan-1-yl (meth)acrylate, 3,5-dicarboxyl-7-methyladamantan-1-yl (meth)acrylate, 3-carboxyl-5-methoxycarbonyl-7-methyladamantan-1-yl (meth)acrylate, 3-methoxycarbonyl-5-methyladamantan-1-yl (meth)acrylate, 3,5-dimethoxycarbonyl-7-methyladamantan-1-yl (meth)acrylate, 3-hydroxy-5-methyladamantan-1-yl-methyl (meth)acrylate, 3,5-dihydroxy-7-methyladamantan-1-yl-methyl (meth)acrylate, 3-hydroxy-5-cyano-7-methyladamantan-1-yl-methyl (meth)acrylate, 3-hydroxy-5-carboxyl-7-methyladamantan-1-yl-methyl (meth)acrylate, 3-hydroxy-5-methoxycarbonyl-7-methyladamantan-1-yl-methyl (meth)acrylate, 3-hydroxymethyl-5-methyl adamantan-1-yl-methyl (meth)acrylate, 3,5-dihydroxymethyl-7-methyladamantan-1-yl-methyl (meth)acrylate, 3-hydroxy-5-hydroxymethyl-7-methyladamantan-1-yl-methyl (meth)acrylate, 3-cyano-5-hydroxymethyl-7-methyladamantan-1-yl-methyl (meth)acrylate, 3-hydroxymethyl-5-carboxyl-7-methyladamantan-1-yl-methyl (meth)acrylate, 3-hydroxymethyl-5-methoxycarbonyl-7-methyladamantan-1-yl-methyl (meth)acrylate, 3-cyano-5-methyladamantan-1-yl-methyl (meth)acrylate, 3,5-dicyano-7-methyladamantan-1-yl-methyl (meth)acrylate, 3-cyano-5-carboxyl-7-methyladamantan-1-yl-methyl (meth)acrylate, 3-cyano-5-methoxycarbonyl-7-methyladamantan-1-yl-methyl (meth)acrylate, 3-carboxyl-5-methyladamantan-1-yl-methyl (meth)acrylate, 3,5-dicarboxyl-7-methyladamantan-1-yl-methyl (meth)acrylate, 3-carboxyl-5-methoxycarbonyl-7-methyladamantan-1-yl-methyl (meth)acrylate, 3-methoxycarbonyl-5-methyladamantan-1-yl-methyl (meth)acrylate, 3,5-dimethoxycarbonyl-7-methyladamantan-1-yl-methyl (meth)acrylate, 3-hydroxy-5,7-dimethyladamantan-1-yl (meth)acrylate, 3-hydroxymethyl-5,7-dimethyladamantan-1-yl (meth)acrylate, 3-cyano-5,7-dimethyladamantan-1-yl (meth)acrylate, 3-carboxyl-5,7-dimethyladamantan-1-yl (meth)acrylate, 3-methoxycarbonyl-5,7-dimethyladamantan-1-yl (meth)acrylate, 3-hydroxy-5,7-dimethyladamantan-1-yl-methyl (meth)acrylate, 3-hydroxymethyl-5,7-dimethyladamantan-1-yl-methyl (meth)acrylate, 3-cyano-5,7-dimethyladamantan-1-yl-methyl (meth)acrylate, 3-carboxyl-5,7-dimethyladamantan-1-yl-methyl (meth)acrylate, 3-methoxycarbonyl-5,7-dimethyladamantan-1-yl-methyl (meth)acrylate and the like can be given.

Among these monomers, 3-hydroxyadamantan-1-yl-methyl (meth)acrylate, 3,5-dihydroxyadamantan-1-yl-methyl (meth)acrylate, 3-cyanoadamantan-1-yl-methyl (meth)acrylate, 3-carboxyladamantan-1-yl-methyl (meth)acrylate, 3-hydroxy-5-methyladamantan-1-yl-(meth)acrylate, 3,5-dihydroxy-7-methyladamantan-1-yl (meth)acrylate, 3-hydroxy-5,7-dimethyladamantan-1-yl (meth)acrylate, 3-carboxyl-5,7-dimethyladamantan-1-yl (meth)acrylate, 3-hydroxy-5,7-dimethyladamantan-1-yl-methyl (meth)acrylate and the like are particularly preferred.

The resin (B) according to the present invention may further comprise a repeating unit (hereinafter referred to as "still other repeating unit") in addition to the repeating units (4), (5), (6) and (7).

Examples of the still other repeating unit include units obtained by cleavage of a polymerizable unsaturated bond in a (meth)acrylate having a bridged hydrocarbon skeleton such as dicyclopentenyl (meth)acrylate and adamantylmethyl (meth)acrylate; a carboxyl group-containing ester having a bridged hydrocarbon skeleton in an unsaturated carboxylic acid such as carboxylnorbornyl (meth)acrylate, carboxytricyclodecanyl (meth)acrylate and carboxytetracycloundecanyl (meth)acrylate;

a (meth)acrylate not having a bridged hydrocarbon skeleton such as methyl (meth)acrylate, ethyl (meth)acrylate, n-propyl (meth)acrylate, n-butyl (meth)acrylate, 2-methylpropyl (meth)acrylate, 1-methylpropyl (meth)acrylate, t-butyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, 4-methoxycyclohexyl (meth)acrylate, 2-cyclopentyloxycarbonylethyl (meth)acrylate, 2-cyclohexyloxycarbonylethyl (meth)acrylate and 2-(4-methoxycyclohexyl)oxycarbonylethyl (meth)acrylate;

an α-hydroxymethyl acrylate such as methyl α-hydroxymethyl acrylate, ethyl α-hydroxymethyl acrylate, n-propyl α-hydroxymethyl acrylate and n-butyl α-hydroxymethyl acrylate; an unsaturated nitrile compound such as (meth)acrylonitrile, α-chloroacrylonitrile, crotonitrile, maleinitrile, fumaronitrile, mesaconitrile, citraconitrile and itaconitrile; an unsaturated amide compound such as (meth) acrylamide, N,N-dimethyl (meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine and vinylimidazole; an unsaturated carboxylic anhydride such as (meth)acrylic acid, crotonic acid, maleic acid, maleic anhydride, fumaric acid, itaconic acid, anhydrous itaconic acid, citraconic acid, anhydrous citraconic acid and mesaconic acid; a carboxyl group-containing ester not having a bridged hydrocarbon skeleton in an unsaturated carboxylic acid such as 2-carboxyethyl (meth)acrylate, 2-carboxypropyl (meth) acrylate, 3-carboxypropyl (meth)acrylate, 4-carboxybutyl (meth)acrylate and 4-carboxycyclohexyl (meth)acrylate;

a polyfunctional monomer having a bridged hydrocarbon skeleton such as 1,2-adamantanediol di(meth)acrylate, 1,3-adamantanediol di(meth)acrylate, 1,4-adamantanediol di(meth)acrylate and tricyclodecanyl dimethylol di(meth) acrylate;

a polyfunctional monomer not having a bridged hydrocarbon skeleton such as methylene glycol di(meth)acrylate, ethylene glycol di(meth)acrylate, propylene glycol di(meth) acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate and 1,3-bis(2-hydroxypropyl)benzene di(meth) acrylate; and the like.

Among these still other repeating units, the units obtained by cleavage of polymerizable unsaturated bond in a (meth) acrylate having a bridged hydrocarbon skeleton and the like are preferable.

The acid-unstable group in the resin (B) according to the present invention preferably has a monocyclic structure or polycyclic structure. Specific examples of the structures include methyl cyclopentyl, ethyl cyclopentyl, methyl cyclohexyl, ethyl cyclohexyl, methyl adamantyl, ethyl adamantyl and the like.

The resin (B) according to the present invention may comprise either one type or two or more types of the repeating units selected from the group consisting of the repeating units (4), (5), (6) and (7) and the still other repeating unit.

The content of the repeating unit (4) in the resin (B) is usually 30 mol % or less, and preferably 25 mol % or less based on 100 mol % of the total of the repeating units in the resin (B). If the content of the repeating unit (4) is more than 30 mol %, shape of a resist pattern may be deteriorated or resolution may be impaired.

The content of the repeating unit (5) in the resin (B) is usually 40 mol % or less, and preferably 30 mol % or less based on 100 mol % of the total of the repeating units in the resin (B). If the content of the repeating unit (5) is more than 40 mol %, radiation transmission may be reduced and pattern profile may be deteriorated.

In addition, the content of the repeating unit (6) is usually 30 mol % or less, and preferably 25 mol % or less based on 100 mol % of the total of the repeating units in the resin (B). If the content of the repeating unit (6) is more than 30 mol %, a resultant resist film tends to swell in an alkali developer.

Further, the content of the repeating unit (7) is usually 30 mol % or less, and preferably 25 mol % or less based on 100 mol % of the total of the repeating units in the resin (B). If the content of the repeating unit (7) is more than 30 mol %, a resultant resist film tends to swell in an alkali developer and solubility in an alkali developer may be decreased.

Moreover, the content of the still other repeating unit is usually 50 mol % or less, and preferably 40 mol % or less based on 100 mol % of the total of the repeating units in the resin (B).

The resin (B) according to the present invention can be produced by polymerizing polymerizable unsaturated monomers corresponding to each repeating unit in the presence of a chain transfer agent as required, using a radical polymerization initiator such as a hydroperoxide, a dialkyl peroxide, a diacyl peroxide, and an azo compound in an appropriate solvent.

Examples of the solvent used for polymerization include an alkane such as n-pentane, n-hexane, n-heptane, n-octane, n-nonane and n-decane; a cycloalkane such as cyclohexane, cycloheptane, cyclooctane, decalin and norbornane; an aromatic hydrocarbon such as benzene, toluene, xylene, ethylbenzene and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate and methyl propionate; a ketone such as 2-butanone, 4-methyl-2-pentanone and 2-heptanone; an ether such as tetrahydrofuran, dimethoxyethanes and diethoxyethanes; and the like. These solvents may be used singly or in combination of two or more thereof.

The polymerization temperature is usually in the range from 40° C. to 150° C., and preferably from 50° C. to 120° C. The reaction time is usually in the range from 1 to 48 hours, and preferably from 1 to 24 hours.

Although not particularly limited, the Mw of the resin (B) according to the present invention determined by GPC is preferably in the range from 1,000 to 100,000, more preferably 1,000 to 30,000, and still more preferably 1,000 to 20,000. If the Mw of the resin (B) is 10,000 or less, heat resistance in a resist tends to be lowered. On the other hand, if the Mw is more than 100,000, developability in a resist tends to be decreased.

The ratio (Mw/Mn) of the Mw to the Mn determined by GPC of the resin (B) is normally in the range from 1 to 5, and preferably 1 to 3.

In the resin (B), the solids content of the low molecular weight components originating from monomers used for preparing the resin (B) is preferably 0.1% or less by weight, more preferably 0.07% or less by weight, and still more preferably 0.05% or less by weight based on 100% by weight of the resin. If the content is less than 0.1% by weight, the eluted amount in the liquid for liquid immersion lithography such as water with which the resist film comes in contact during exposure can be reduced. In addition, it is possible to prevent generation of extraneous substances in the resist during storage, inhibit uneven resist application, and sufficiently suppress defects during pattern formation.

Examples of the above-mentioned low molecular weight components originating from the monomers include a monomer, a dimer, a trimer and an oligomer, and they may be ones having Mw of 500 or less. The component having Mw of 500 or less can be removed by the purification method to be described. The amount of the low molecular weight components can be determined by analysis of the resin using high performance liquid chromatography (HPLC).

It is preferable that the resin (B) contain almost no impurities comprising halogens or metals. That can provide a resist leading to improved sensitivity, resolution, process stability, pattern shape and the like.

The resin (B) can be purified by a chemical purification method such as washing with water and liquid-liquid extraction, a combination of the chemical purification method and a physical purification method such as ultrafiltration and centrifugation, or the like.

In the present invention, the resin (B) may be used singly or in combination of two or more thereof.

<Radiation-Sensitive Acid Generator (C)>

The radiation-sensitive acid generator (C) according to the present invention (hereinafter referred to as "acid generator (C)") is a compound which produces an acid by being exposed to light, causes an acid-dissociable group in the repeating unit (2) in the resin component to dissociate (disconnect a protective group) by the function of the resultant acid to make the exposed part of the resist film readily soluble in an alkaline developer, and form a positive-tone resist pattern.

The acid generator (C) is preferably one containing the following compound represented by the general formula (7) (hereinafter referred to as "acid generator 1").

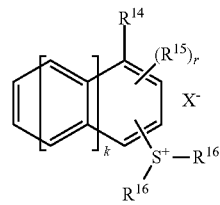

(7)

In the general formula (7), $R^{14}$ represents hydrogen atom, fluorine atom, hydroxyl group, a linear or branched alkyl group having 1 to 10 carbon atoms, a linear or branched alkoxyl group having 1 to 10 carbon atoms, or a linear or branched alkoxycarbonyl group having 2 to 11 carbon atoms, $R^{15}$ represents a linear or branched alkyl group having 1 to 10 carbon atoms, an alkoxyl group, or a linear, branched or cyclic alkanesulfonyl group having 1 to 10 carbon atoms, $R^{16}$ individually represents a linear or branched alkyl group having 1 to 10 carbon atoms, a phenyl group that may be substituted, or a naphthyl group that may be substituted, or two $R^{16}$s bond to form a divalent group which has 2 to 10 carbon atoms and may be substituted, k is an integer of 0 to 2, $X^-$ represents the general formula $R^{17}C_nF_{2n}SO_3^-$ or $R^{17}SO_3^-$ (wherein $R^{17}$ represents fluorine atom or a hydrocarbon group having 1 to 12 carbon atoms, and n is an integer of 1 to 10), or the following anion represented by the general formula (8-1) or (8-2), and r is an integer of 0 to 10;

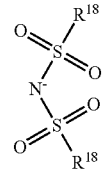

(8-1)

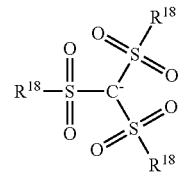

(8-2)

[In the formulas, $R^{18}$ individually represents a linear or branched alkyl group having fluorine atom and 1 to 10 carbon atoms, or two $R^{18}$s in combination represent a divalent organic group having fluorine atom and 2 to 10 carbon atoms, wherein the divalent organic group may have a substituent.]

In the general formula (7), examples of the linear or branched alkyl group having 1 to 10 carbon atoms represented by $R^{14}$, $R^{15}$ and $R^{16}$ include methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, n-decyl group and the like. Among these alkyl groups, methyl group, ethyl group, n-butyl group, t-butyl group and the like are preferable.

Examples of the linear or branched alkoxyl group having 1 to 10 carbon atoms represented by $R^{14}$ and $R^{15}$ include methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, n-decyloxy group and the like. Among these, methoxy group, ethoxy group, n-propoxy group and n-butoxy group are preferable.

Examples of the linear or branched alkoxycarbonyl group having 2 to 11 carbon atoms represented by $R^{14}$ include methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, n-decyloxycarbonyl group and the like. Among these alkoxycarbonyl groups, methoxycarbonyl group, ethoxycarbonyl group, n-butoxycarbonyl group and the like are preferable.

In addition, examples of the linear, branched or cyclic alkanesulfonyl group having 1 to 10 carbon atoms represented by $R^{15}$ include methanesulfonyl group, ethanesulfonyl group, n-propanesulfonyl group, n-butanesulfonyl group, tert-butanesulfonyl group, n-pentanesulfonyl group, neopentanesulfonyl group, n-hexanesulfonyl group, n-heptanesulfonyl group, n-octanesulfonyl group, 2-ethylhexanesulfonyl group, n-nonanesulfonyl group, n-decanesulfonyl group, cyclopentanesulfonyl group, cyclohexanesulfonyl group and the like. Among these alkanesulfonyl groups, methanesulfonyl group, ethanesulfonyl group, n-propanesulfonyl group, n-butanesulfonyl group, cyclopentansulfonyl group, cyclohexanesulfonyl group and the like are preferable.

Further, r is preferably 0 to 2.

In the general formula (7), examples of the substituted or unsubstituted phenyl group represented by $R^{16}$ include phenyl group and a phenyl group substituted with a linear, branched or cyclic alkyl group having 1 to 10 carbon atoms including o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, 4-ethylphenyl group, 4-t-butylphenyl group, 4-cyclohexylphenyl group and 4-fluorophenyl group; a group in which each of phenyl group and alkyl-substituted phenyl group is substituted with one or more groups selected from the group consisting of hydroxyl group, carboxyl group, cyano group, nitro group, an alkoxyl group, an alkoxyalkyl group, an alkoxycarbonyl group and an alkoxycarbonyloxy group; and the like.

Examples of the alkoxyl group as the substituent for the phenyl group or alkyl-substituted phenyl group include a linear, branched, or cyclic alkoxyl group having 1 to 20 carbon atoms such as methoxy group, ethoxy group, n-propoxy group, i-propoxy group, n-butoxy group, 2-methylpropoxy group, 1-methylpropoxy group, t-butoxy group, cyclopentyloxy group and a cyclohexyloxy group; and the like.

Examples of the alkoxyalkyl group include a linear, branched or cyclic alkoxyalkyl group having 2 to 21 carbon atoms such as methoxymethyl group, ethoxymethyl group, 1-methoxyethyl group, 2-methoxyethyl group, 1-ethoxyethyl group and 2-ethoxyethyl group; and the like.

Examples of the alkoxycarbonyl group include a linear, branched or cyclic alkoxycarbonyl group having 2 to 21 carbon atoms such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group and cyclohexyloxycarbonyl group; and the like.

Additionally, examples of the alkoxycarbonyloxy group include a linear, branched or cyclic alkoxycarbonyloxy group having 2 to 21 carbon atoms such as methoxycarbonyloxy group, ethoxycarbonyloxy group, n-propoxycarbonyloxy group, i-propoxycarbonyloxy group, n-butoxycarbonyloxy group, t-butoxycarbonyloxy group, cyclopentyloxycarbonyl group and a cyclohexyloxycarbonyl group; and the like.

Examples of the phenyl group that may be substituted as $R^{15}$ in the general formula (7) include phenyl group, 4-cyclohexylphenyl group, 4-t-butylphenyl group, 4-methoxyphenyl group, 4-t-butoxyphenyl group and the like.

Examples of the naphthyl group that may be substituted as $R^{16}$ include a naphthyl group such as 1-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group and 4-methyl-2-naphthyl group, and a substituted naphthyl group with a linear, branched or cyclic alkyl group having 1 to 10 carbon atoms; a group in which each of naphthyl group and alkyl-substituted naphthyl group is substituted with one or more groups selected from the group consisting of hydroxyl group, carboxyl group, cyano group, nitro group, an alkoxyl group, an alkoxyalkyl group, an alkoxycarbonyl group and an alkoxycarbonyloxy group; and the like.

Examples of the alkoxyl group, alkoxyalkyl group, alkoxycarbonyl group and alkoxycarbonyloxy group which are substituents include groups exemplified for the above-mentioned phenyl group and alkyl-substituted phenyl group.

The naphthyl group that may be substituted as $R^{16}$ in the general formula (7) are preferably 1-naphthyl group, 1-(4-methoxynaphthyl) group, 1-(4-ethoxynaphthyl) group, 1-(4-n-propoxynaphtyl) group, 1-(4-n-butoxynaphthyl) group, 2-(7-methoxynaphtyl) group, 2-(7-ethoxynaphtyl) group, 2-(7-n-propoxynaphtyl) group, 2-(7-n-butoxynaphtyl) group and the like.

Preferable example of the divalent group having 2 to 10 carbon atoms formed by two $R^{16}$s is a group capable of forming a 5 or 6 member ring together with the sulfur atom in the general formula (7), particularly a 5 member ring (i.e. tetrahydrothiophene ring).

Additionally, examples of the substituent in the above divalent group include a group such as hydroxyl group, carboxyl group, cyano group, nitro group, an alkoxyl group, an alkoxyalkyl group, an alkoxycarbonyl group and an alkoxycarbonyloxy group that are exemplified for the above-mentioned phenyl group and alkyl-substituted phenyl group, and the like.

Preferable examples of $R^{16}$ in the general formula (7) are methyl group, ethyl group, phenyl group, 4-methoxyphenyl group, 1-naphthyl group, and a divalent group having a tetrahydrothiophene cyclic structure in which two $R^{16}$s and sulfur atom are bonded, and the like.

$X^-$ in the general formula (7) is an anion represented by $R^{17}C_nF_{2n}SO_3^-$, $R^{17}SO_3^-$, or the above formulas (8-1) or (8-2). When $X^-$ is $R^{17}C_nF_{2n}SO_3^-$, —$C_nF_{2n}$— group is a perfluoroalkyl group having carbon atoms of the number n. This group may be linear or branched. And n is preferably 1, 2, 4 or 8.

The hydrocarbon group having 1 to 12 carbon atoms that may be substituted as $R^{17}$ is preferably an alkyl group having 1 to 12 carbon atoms, a cycloalkyl group or a bridge alicyclic hydrocarbon group.

Specific examples include methyl group, ethyl group, n-propyl group, i-propyl group, n-butyl group, 2-methylpropyl group, 1-methylpropyl group, t-butyl group, n-pentyl group, neopentyl group, n-hexyl group, cyclohexyl group, n-heptyl group, n-octyl group, 2-ethylhexyl group, n-nonyl group, n-decyl group, norbornyl group, norbornylmethyl group, hydroxynorbornyl group, adamantyl group and the like.

Additionally, $R^{18}$ in the case where $X^-$ is the above anion represented by the general formula (8-1) or (8-2), individually may represents a linear or branched alkyl group having fluorine atom and 1 to 10 carbon atoms, or two $R^{18}$s in combination may represent a divalent organic group having fluorine atom and 2 to 10 carbon atoms, in this case, the divalent organic group may have a substituent.

In the case where $R^{18}$ in the general formula (8-1) or (8-2) is a linear or branched alkyl group having 1 to 10 carbon atoms, example thereof include trifluoromethyl group, pentafluoroethyl group, heptafuluoropropyl group, nonafluorobutyl group, dodecafluoropentyl group, perfluorooctyl group and the like.

Additionally, in the case where $R^{18}$ is a divalent organic group having 2 to 10 carbon atoms, example thereof include tetrafluoroethylene group, hexafluoropropylene group, octafluorobutylene group, decafluoropentylene group, undecafluorohexylene group and the like.

Accordingly, preferable examples of the anion $X^-$ in the general formula (7) include trifluoromethanesulfonate anion, perfluoro-n-butanesulfonate anion, perfluoro-n-octanesulfonate anion, 2-bicyclo[2.2.1]hept-2-yl-1,1,2,2-tetrafluoroethanesulfonate anion, 2-bicyclo[2.2.1]hept-2-yl-1,1-difluoroethanesulfonate anion and anions represented by the following formulas (9-1) to (9-7).

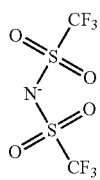

(9-1)

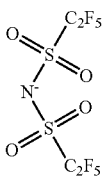

(9-2)

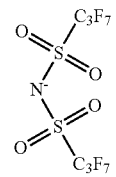

(9-3)

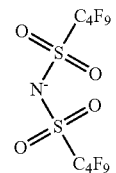

(9-4)

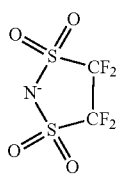

(9-5)

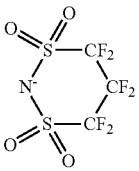

(9-6)

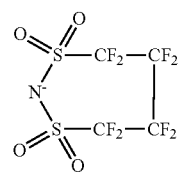

(9-7)

Specific examples of preferable compound represented by the general formula (7) include triphenylsulfonium trifluoromethanesulfonate, tri-tert-butylphenylsulfonium trifluoromethanesulfonate, 4-cyclohexylphenyl-diphenylsulfonium trifluoromethanesulfonate, 4-methanesulfonylphenyl-diphenylsulfonium trifluoromethanesulfonate, 1-(3,5-dimethyl-4-hydroxyphenyl)tetrahydrothiophenium trifluoromethanesulfonate, 1-(4-n-butoxynaphthyl)tetrahydrothiophenium trifluoromethanesulfonate, triphenylsulfonium perfluoro-n-butanesulfonate, tri-tert-butylphenylsulfonium perfluoro-n-butanesulfonate, 4-cyclohexylphenyl-diphenylsulfonium perfluoro-n-butanesulfonate, 4-methanesulfonylphenyl-diphenylsulfonium perfluoro-n-butanesulfonate, 1-(3,5-dimethyl-4-hydroxyphenyl)tetrahydrothiophenium perfluoro-n-butanesulfonate, 1-(4-n-butoxynaphthyl)tetrahydrothiophenium perfluoro-n-butanesulfonate, triphenylsulfonium perfluoro-n-octanesulfonate, tri-tert-butylphenylsulfonium perfluoro-n-octanesulfonate, 4-cyclohexylphenyl-diphenylsulfonium perfluoro-n-octanesulfonate, 4-methanesulfonylphenyl-diphenylsulfonium perfluoro-n-octanesulfonate, 1-(3,5-dimethyl 4-hydroxyphenyl)tetrahydrothiophenium perfluoro-n-octanesulfonate, 1-(4-n-butoxynaphthyl)tetrahydrothiophenium perfluoro-n-octanesulfonate, triphenylsulfonium 2-(bicyclo[2.2.1]hept-2'-yl)-1,1,2,2-tetrafluoroethanesulfonate, tri-tert-butylphenylsulfonium 2-(bicyclo[2.2.1]hept-2'-yl)-1,1,2,2-tetrafluoroethanesulfonate, 4-cyclohexylphenyl-diphenylsulfonium 2-(bicyclo[2.2.1]hept-2'-yl)-1,1,2,2-tetrafluoroethanesulfonate, 4-methanesulfonylphenyldiphenylsulfonium 2-(bicyclo[2.2.1]hept-2'-yl)-1,1,2,2-tetrafluoroethanesulfonate, 1-(3,5-dimethyl-4-hydroxyphenyl)tetrahydrothiophenium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethanesulfonate, tri-tert-butylphenylsulfonium 2-(bicyclo[2.2.1]hept-2'-yl)-1,1-difluoroethanesulfonate, 4-cyclohexylphenyldiphenylsulfonium 2-(bicyclo[2.2.1]hept-2'-yl)-1,1-difluoroethanesulfonate, 4-methanesulfonylphenyldiphenylsulfonium 2-(bicyclo[2.2.1]hept-2'-yl)-1,1-difluoroethanesulfonate, 1-(3,5-dimethyl-4-hydroxyphenyl)tetrahydrothiophenium 2-(bicyclo[2.2.1]hept-2'-yl)-1,1-difluoroethanesulfonate, 1-(4-n-butoxynaphthyl)tetrahydrothiophenium 2-(bicyclo[2.2.1]hept-2'-yl)-1,1-difluoroethanesulfonate, compounds represented by the following formulas B1 to B15, and the like.

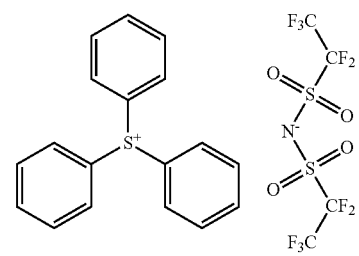

B1

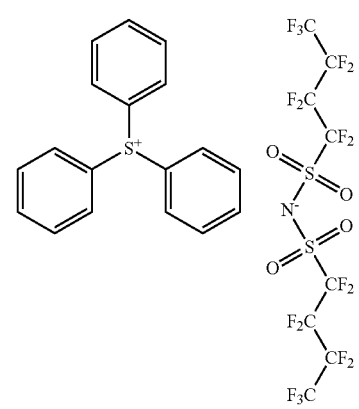

B2

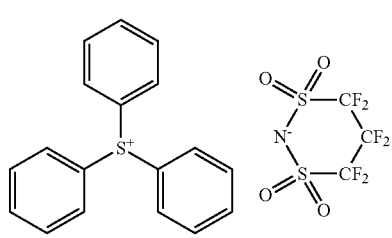

B3

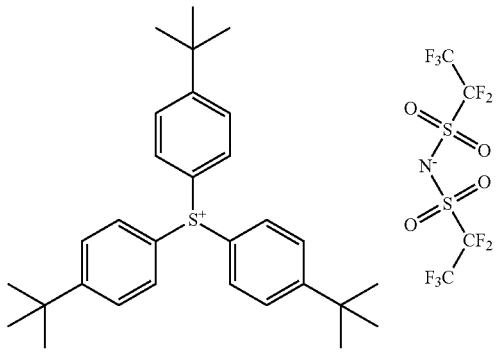

B4

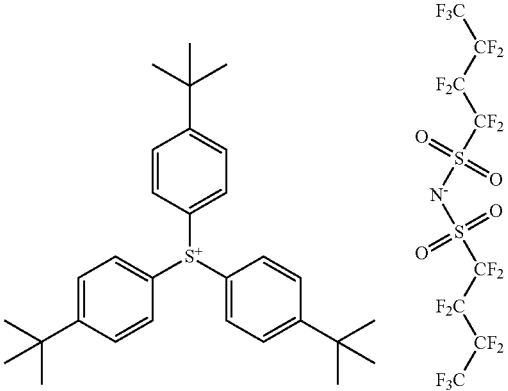

B5

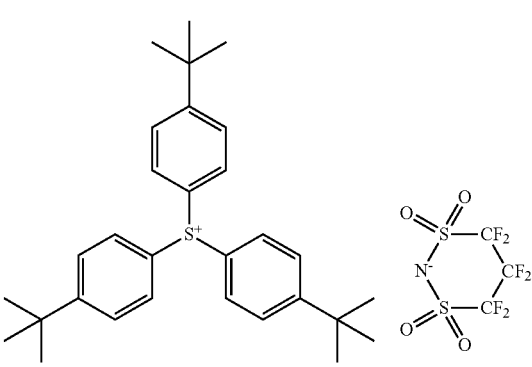

B6

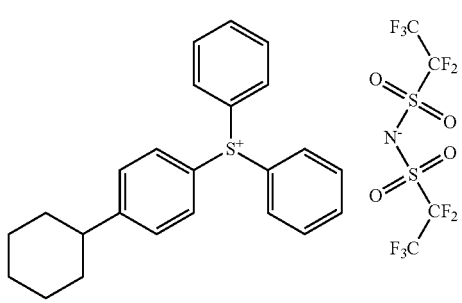

B7

-continued

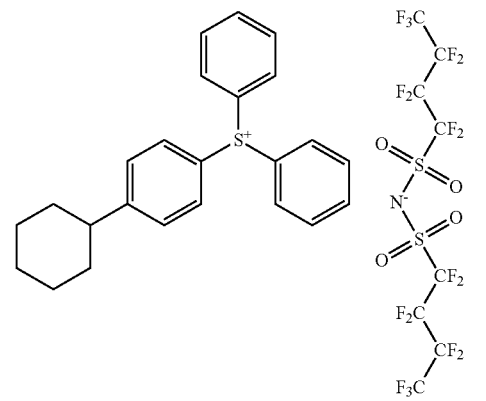
B8

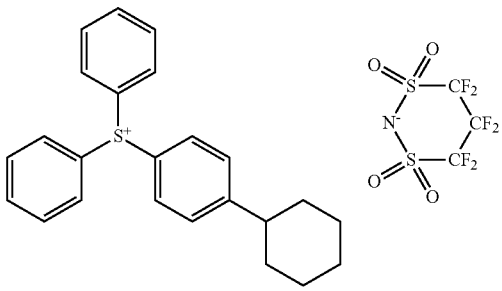
B9

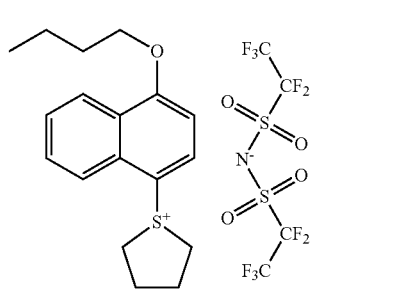
B10

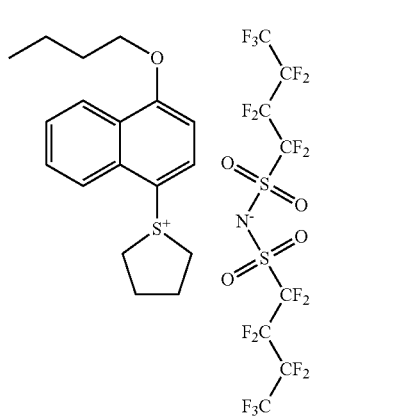
B11

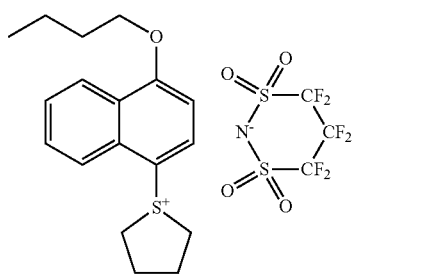
B12

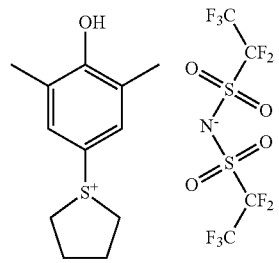
B13

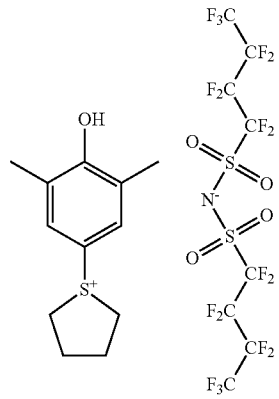
B14

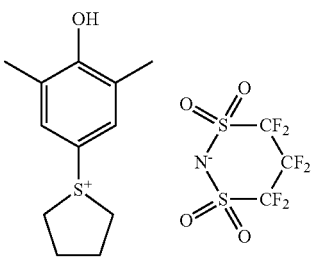
B15

In the present invention, the acid generator 1 may be used singly or in combination of two or more thereof.

Additionally, examples of the acid generator which can be used as the radiation-sensitive acid generator (C) other than the acid generator 1 (hereinafter referred to as "other acid generator") include an onium salt compound, a halogen-containing compound, a diazoketone compound, a sulfone compound, a sulfonic acid compound and the like. Examples of the other acid generator are given below.

Onium Salt Compound:

Examples of the onium salt compound include an iodonium salt, a sulfonium salt, a phosphonium salt, a diazonium salt, a pyridinium salt and the like.

Specific examples of the onium salt compound include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl 2-oxocyclohexyl methylsulfonium trifluoromethanesulfonate, dicyclohexyl 2-oxocyclohexylsulfonium trifluoromethanesulfonate, 2-oxocyclohexyldimethylsulfonium trifluoromethanesulfonate and the like.

Halogen-Containing Compound:

Examples of the halogen-containing compound include a haloalkyl group-containing hydrocarbon compound, a haloalkyl group-containing heterocyclic compound and the like.

Specific examples of the halogen-containing compound include, (trichloromethyl)-s-triazine derivatives such as phenylbis(trichloromethyl)-s-triazine, 4-methoxyphenylbis(trichloromethyl)-s-triazine and 1-naphthylbis(trichloromethyl)-s-triazine; 1,1-bis(4-chlorophenyl)-2,2,2-trichloroethane and the like.

Diazoketone Compound:

Examples of the diazoketone compound include a 1,3-diketo-2-diazo compound, a diazobenzoquinone compound, a diazonaphthoquinone compound and the like.

Specific examples of the diazoketone compound include 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4-hydroxyphenyl)ethane and the like.

Sulfone Compound:

Examples of the sulfone compound include a β-ketosulfone, a β-sulfonylsulfone, an α-diazo compound of these compounds and the like.

Specific examples of the sulfone compound include 4-trisphenacylsulfone, mesitylphenacylsulfone, bis(phenylsulfonyl)methane and the like.

Sulfonic Acid Compound:

Examples of the sulfonic acid compound include an alkyl sulfonate, an alkylimide sulfonate, a haloalkyl sulfonate, an aryl sulfonate, an imino sulfonate and the like.

Specific examples of the sulfone compound include benzoin tosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate and the like.

Among these other acid generators, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl 2-oxocyclohexyl methylsulfonium trifluoromethanesulfonate, dicyclohexyl 2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate and the like are preferable.

These other acid generators may be used singly or in combination of two or more thereof.

Total amount of the acid generator 1 and other acid generator in the present invention is usually 0.1 to 20 parts by weight, and preferably 0.5 to 10 parts by weight based on 100 parts by weight of the polymer (A) and the resin (B) in order to ensure a resist excellent in sensitivity and developability. In this case if this total amount is less than 0.1 part by weight, sensitivity and developability tend to be impaired. On the other hand, if the total amount is more than 20 parts by weight, transparency of a radiation tends to be decreased, which makes it difficult to obtain a rectangular resist pattern.

The proportion of the other acid generator to be added is 80% or less by weight, and preferably 60% or less by weight based on the total amount of the acid generator 1 and other acid generator.

<Nitrogen-Containing Compound (D)>

The nitrogen-containing compound (D) is a component which controls diffusion of an acid generated from the acid generator upon exposure in the resist film and hinders undesired chemical reactions in the unexposed area. When the acid diffusion controller is added, storage stability of the resulting radiation-sensitive resin composition is improved. In addition, resolution in a resist may be further improved and changing of a resist pattern line width due to fluctuation of post-exposure delay (PED) from exposure to post-exposure heat treatment can be suppressed, whereby a composition with remarkably superior process stability can be obtained.

Examples of the nitrogen-containing compound (D) include a tertiary amine compound, other amine compounds, an amide group-containing compound, a urea compound, a nitrogen-containing heterocyclic compound and the like.

Preferable examples of the tertiary amine compound include a mono(cyclo)alkylamine such as n-hexylamine, n-heptylamine, n-octylamine, n-nonylamine, n-decylamine and cyclohexylamine; a di(cyclo)alkylamine such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; a tri(cyclo)alkylamine such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine and tricyclohexylamine; a substituted alkylamine such as 2,2',2"-nitrotriethanol; aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, 2,6-diisopropylaniline and the like.

Preferable examples of the above-mentioned other amine compound include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'- diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl) ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine and the like.

Preferable examples of the preferable amide group-containing compound include an N-t-butoxycarbonyl group-containing amino compound such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N-t-butoxycarbonylpiperidine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate and the like.

Preferable examples of the urea compound include urea, methylurea, 1,1-dimethylurea, 1,3-dimethylurea, 1,1,3,3-tetramethylurea, 1,3-diphenylurea, tri-n-butylthiourea and the like.

Preferable examples of the other nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine and 2,2':6',2''-terpyridine; piperazines such as piperazine and 1-(2-hydroxyethyl)piperazine; pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane and the like.

The above-mentioned nitrogen-containing compounds (D) may be used singly or in combination of two or more thereof.

The amount of the acid diffusion controller (nitrogen-containing compound (D)) to be added is usually 15 parts or less by weight, preferably 10 parts or less by weight, and more preferably 5 parts or less by weight based on 100 parts by weight of the total of the polymer (A) and the resin (B). If the amount of the acid diffusion controller to be added exceeds 15 parts by weight, sensitivity in a resist tends to be lowered. On the other hand, if the amount is less than 0.001 part by weight, the pattern shape or dimensional accuracy in a resist may be decreased depending on the processing conditions.

<Solvent (E)>

The radiation-sensitive resin composition of the present invention is usually prepared in the form of a composition solution by dissolving the composition in a solvent so that the total solid content is usually in the range from 1% to 50% by weight, and preferably 1% to 25% by weight, and filtering the solution with a filter having a pore diameter of about 0.2 μm, for example.

Examples of the solvent (E) include a linear or branched ketone such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone and 2-octanone; a cyclic ketone such as cyclopentanone, 3-methylcyclopentanone, cyclohexanone, 2-methylcyclohexanone, 2,6-dimethylcyclohexanone and isophorone; a propylene glycol monoalkyl ether acetate such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate and propylene glycol mono-t-butyl ether acetate; an alkyl 2-hydroxypropionate such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate and t-butyl 2-hydroxypropionate; an alkayl 3-alkoxypropionate such as methyl 3-methoxypropionate, ethyl 3-methoxypropionate, methyl 3-ethoxypropionate and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and the like.

Among these, a linear or branched ketone, a cyclic ketone, a propylene glycol monoalkyl ether acetate, an alkyl 2-hydroxypropionate, an alkyl 3-alkoxypropionate, γ-butyrolactone and the like are preferable.

These solvents (E) may be used singly or in combination of two or more thereof.

<Additives>

The radiation-sensitive resin composition of the present invention optionally comprises various additives such as an aliphatic additive, a surfactant and a sensitizer.

The alicyclic additive is a component which further improves dry etching tolerance, pattern shape, adhesion to substrate, and the like.

Examples of the alicyclic additive include an adamantane derivative such as 1-adamantanecarboxylic acid, 2-adamantanone, t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate and 2,5-dimethyl-2,5-di(adamantylcarbonyloxy)hexane; a deoxycholate such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate and mevalonolactone deoxycholate; a lithocholate such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate and mevalonolactone lithocholate; an alkyl carboxylate such as dimethyl adipate, diethyl adipate, dipropyl adipate, di-n-butyl adipate and di-t-butyl adipate; 3-[2-hydroxy-2,2-bis(trifluoromethyl)ethyl]tetracyclo[$4.4.0.1^{2,5}.1^{7,10}$]dodecane and the like. These alicyclic additives may be used singly or in combination of two or more thereof.

The surfactant is a component which improves applicability, striation, developability and the like.

Examples of the surfactant include a nonionic surfactant such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like. These surfactants may be used singly or in combination of two or more thereof.

Additionally, the sensitizer is one that absorbs radiation energy and transmits the energy to the acid generator (B), and exhibit the function of the increasing the amount of an acid thereby. The sensitizer has an improving effect of apparent sensitivity of the radiation-sensitive resin composition.

Examples of the sensitizer include carbazoles, acetophenones, benzophenones, naphthalenes, phenols, biacetyl, Eosine, Rose Bengal, pyrenes, anthracenes, phenothiazines and the like. These sensitizers may be used singly or in combination of two or more thereof.

Further, when a dye or a pigment is formulated, a latent image in the exposed area can be visualized, thereby decreasing the effects of halation during exposure. Use of an adhesion aid improves adhesivity to the substrate.

Examples of other additives include an alkali-soluble resin, a low molecular weight alkali solubility controller containing an acid dissociable protecting group, a halation inhibitor, a preservation stabilizer, an antifoaming agent and the like.

<Forming Method of Resist Pattern>

The radiation-sensitive resin composition of the present invention is particularly useful for a chemically-amplified resist. In the chemically-amplified resist, an acid-dissociable group in the resin component, mainly resin (B) is dissociated by the function of an acid generated from the acid generator upon exposure, thereby producing a carboxyl group. As a result, solubility of the exposed part of the resist in an alkaline developer is increased, whereby the exposed part is dissolved in the alkaline developer and removed to obtain a positive-tone resist pattern.

In order to form a resist pattern using the radiation-sensitive resin composition of the present invention, the resin composition solution is coated to, for example, a substrate such as a silicon wafer and a wafer coated with aluminum using an appropriate application method including rotational coating, cast coating, roll coating and the like. The resist film is then optionally pre-baked (hereinafter, referred to as "PB") and exposed to radiation so as to form a prescribed resist pattern. The radiation used for exposure is appropriately selected from visible rays, ultraviolet rays, deep ultraviolet rays, X-rays, charged particle beams or the like depending on types of the acid generator. Among these, deep ultraviolet rays represented by ArF excimer laser (wavelength: 193 nm) or KrF excimer laser (wavelength: 248 nm) are preferred. ArF excimer laser (wavelength: 193 nm) is particularly preferable.

The exposure conditions such as exposure dose are appropriately determined depending on the composition of the radiation-sensitive resin composition, types of additives, and the like. In the present invention, it is preferable to perform post-exposure bake (PEB) after exposure. PEB ensures smooth dissociation of the acid-dissociable group in the resin component. The heating temperature for PEB is usually in the range from 30° C. to 200° C., and preferably 50° C. to 170° C., although the heating conditions are changed depending on the composition of the radiation-sensitive resin composition.

In order to bring out the potential of the radiation-sensitive resin composition to the maximum extent, an organic or inorganic antireflection film may be formed on the substrate using a method described in, for example, JP-B H6-12452 (JP-A S59-93448) or the like. A protective film may be provided on the resist film in order to prevent an adverse effect of basic impurities and the like that are present in the environmental atmosphere using a method described in, for example, JP-A H5-188598 or the like. Moreover, in order to prevent the acid generator and the like from flowing out of the resist film during liquid immersion lithography, a protective film for liquid immersion lithography may be provided on the resist film using a method described in, for example, JP-A 2005-352384 or the like. These techniques may be used in combination.

The exposed resist film is then developed to form a prescribed resist pattern. The developer for development is preferably an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene and 1,5-diazabicyclo-[4.3.0]-5-nonene. The concentration of the alkaline aqueous solution is usually 10% or less by weight. If the concentration of the alkaline aqueous solution exceeds 10% by weight, an unexposed part may be dissolved in the developer and it is unfavorable.

The developer containing the alkaline aqueous solution may comprise an organic solvent. Examples of the organic solvent include a ketone such as acetone, methyl ethyl ketone, methyl isobutyl ketone, cyclopentanone, cyclohexanone, 3-methylcyclopentanone and 2,6-dimethylcyclohexanone; an alcohol such as methanol, ethanol, n-propanol, i-propanol, n-butanol, t-butanol, cyclopentanol, cyclohexanol, 1,4-hexanediol and 1,4-hexanedimethylol; an ether such as tetrahydrofuran and dioxane; an ester such as ethyl acetate, n-butyl acetate and i-amyl acetate; an aromatic hydrocarbon such as toluene and xylene; phenol, acetonylacetone, dimethylformamide; and the like. These organic solvents may be used singly or in combination of two or more thereof. The amount of the organic solvent to be used is preferably 100% or less by volume of the alkaline aqueous solution. The amount of the organic solvent exceeding 100% by volume may decrease developability, giving rise to a larger undeveloped portion in the exposed area. In addition, an appropriate amount of a surfactant and the like may be added to the developer containing the alkaline aqueous solution.

After development using the developer containing alkaline aqueous solution, washing with water is generally carried out dried.

EXAMPLES

Embodiments of the present invention are described in detail hereinafter using examples. The present invention is in no way limited by these examples. In addition, "part" is based on mass unless otherwise indicated.

Measurement and evaluation in Synthesis Examples were carried out according to the methods as follows.

(1) Mw and Mn

These were measured by gel permeation chromatography (GPC) with monodispersed polystyrene as a standard reference material using GPC column ("G2000HXL"×2, "G3000HXL"×1, "G4000HXL"×1) manufactured by Tosoh Corp. under the following analysis conditions. Flow rate: 1.0 ml/min., eluate: tetrahydrofuran, column temperature: 40° C. Dispersibility Mw/Mn was calculated from the measurement result.

(2) $^{13}$C-NMR Analysis $^{13}$C-NMR analysis of the polymer was carried out using "JNM-EX270" manufactured by JEOL Ltd.

(3) Amount of Low Molecular Weight Components Originating from Monomers

The amount of low molecular components originating from monomers in 100% by weight of the polymer obtained in each Synthesis Example was measured by high performance liquid chromatography (HPLC) using "Intersil ODS-25 μm column" (4.6 mmφ×250 mm) manufactured by GL Sciences Inc., and an eluate of an acrylonitrile/0.1% phosphoric acid aqueous solution at a flow rate of 1.0 mL/min.

Hereinafter, Synthesis Example is described.

The monomers used for the synthesis of the fluorine-containing polymers (A) and the resins (B) are shown hereinunder by the formulas (M-1) to (M-12).

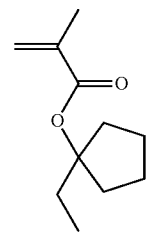

(M-1)

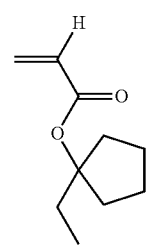

(M-2)

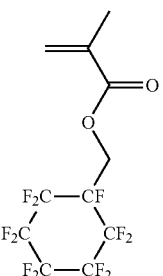

(M-3)

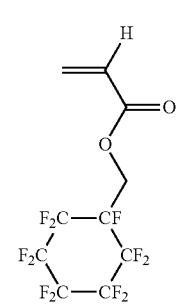

(M-4)

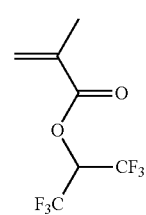

(M-5)

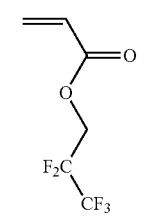

(M-6)

(M-7) 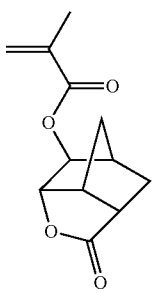

(M-8) 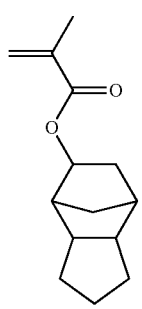

(M-9) 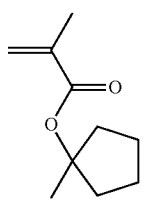

(M-10) 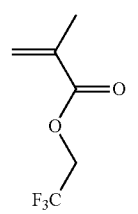

(M-11) 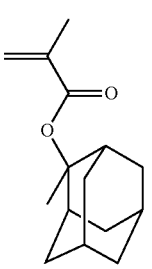

(M-12) 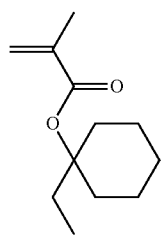

<Synthesis of Fluorine-Containing Polymers (A-1) to (A-13)>

Monomers and an initiator (MAIB; dimethyl-2,2'-azobis-iso-butyrate) were used at amounts corresponding to mol % according to the formulation shown in Table 1 and dissolved in 50 g of methyl ethyl ketone to prepare a monomer solution. The total amount of the monomers before starting preparation was adjusted to 50 g. The mol % of each monomer indicates mol % in the total amount of the monomers, and the mol % of each initiator indicates mol % in the total amount of the monomers and the initiators.

On the other hand, 50 g of methyl ethyl ketone was charged into a 500-mL three-necked flask equipped with a thermometer and a dropping funnel and nitrogen was purged for 30 minutes. After that, the content in the flask was heated to 80° C. while stirring using a magnetic stirrer.

Subsequently, the above monomer solution was added dropwise to the flask using a dropping funnel over three hours. After the addition, the mixture was aged for three hours, and allowed to cool to a temperature of 30° C. or lower, thereby obtaining a copolymer solution.

For post treatment, the fluorine-containing polymers (A-1) to (A-11) were purified by the following purification method (I) and the fluorine-containing polymers (A-12) and (A-13) were purified by the following purification method (II).

Purification Method (I)

The reaction solution was added to a solvent for reprecipitation (refer to Table 1) whose amount is five times of the amount of the reaction solution, stirring was performed for 30 minutes, filtered, and then rinsing was carried out twice in 200 mL of methanol. The resultant copolymers were subjected to measurement for Mw, Mw/Mn (molecular weight dispersivity), yield (% by weight), content of low molecular weight components (% by weight), and ratio of the repeating units in the copolymers. The results are shown in Table 2.

Purification Method (II)

The reaction solution was transferred to a 2-L separatory funnel and then homogeneously diluted with 150 g of n-hexane (solvent A), 600 g of methanol (solvent B) was added, and the mixture was stirred. Subsequently, 30 g of distilled water was charged, followed by stirring for 30 minutes. The lower layer was collected to obtain a propylene glycol monomethyl ether acetate solution. The resultant copolymers were subjected to measurement for Mw, Mw/Mn, yield, content of low molecular weight components, and ratio of the repeating units in the copolymers. The results are shown in Table 2.

TABLE 1

|  | Polymer (A) | Monomer 1 | Amount (mol %) | Monomer 2 | Amount (mol %) | Monomer 3 | Amount (mol %) | Initiator (mol %) | Solvent for reprecipitation |
|---|---|---|---|---|---|---|---|---|---|
| Polymerization Example 1 | A-1 | M-1 | 70 | M-3 | 30 | — |  | 8 | Methanol |
| Polymerization Example 2 | A-2 | M-2 | 70 | M-3 | 30 | — |  | 8 | Methanol/water = 4/1 |
| Polymerization Example 3 | A-3 | M-1 | 70 | M-4 | 30 | — |  | 8 | Methanol/water = 4/1 |
| Polymerization Example 4 | A-4 | M-1 | 70 | M-5 | 30 | — |  | 8 | Methanol/water = 4/1 |
| Polymerization Example 5 | A-5 | M-1 | 85 | M-5 | 15 | — |  | 8 | Methanol/water = 4/1 |
| Polymerization Example 6 | A-6 | M-1 | 30 | M-5 | 70 | — |  | 8 | Methanol/water = 4/1 |
| Polymerization Example 7 | A-7 | M-1 | 70 | M-6 | 30 | — |  | 8 | Methanol |
| Polymerization Example 8 | A-8 | M-1 | 85 | M-5 | 15 | — |  | 12 | Methanol |
| Polymerization Example 9 | A-9 | M-1 | 70 | M-5 | 15 | M-7 | 15 | 8 | Methanol |
| Polymerization Example 10 | A-10 | M-1 | 80 | M-5 | 15 | M-7 | 5 | 8 | Methanol |
| Polymerization Example 11 | A-11 | M-1 | 70 | M-10 | 30 | — |  | 8 | Methanol/water = 4/1 |
| Polymerization Example 12 | A-12 | M-1 | 70 | M-10 | 30 | — |  | 8 | — |
| Polymerization Example 13 | A-13 | M-1 | 85 | M-5 | 15 | — |  | 12 | — |

TABLE 2

|  | Polymer (A) | Yield (%) | Low molecular weight component (%) | Mw | Mw/Mn | Monomer 1 (mol %) | Monomer 2 (mol %) | Monomer 3 (mol %) |
|---|---|---|---|---|---|---|---|---|
| Polymerization Example 1 | A-1 | 64 | <0.1 | 6,600 | 1.51 | 67.4 | 32.6 | — |
| Polymerization Example 2 | A-2 | 29 | <0.1 | 9,100 | 1.77 | 57.4 | 42.6 | — |
| Polymerization Example 3 | A-3 | 86 | <0.1 | 8,200 | 1.87 | 68.8 | 31.2 | — |
| Polymerization Example 4 | A-4 | 82 | <0.1 | 5,900 | 1.87 | 71.6 | 28.4 | — |
| Polymerization Example 5 | A-5 | 79 | <0.1 | 5,200 | 1.82 | 85.5 | 14.5 | — |
| Polymerization Example 6 | A-6 | 68 | <0.1 | 6,400 | 1.63 | 33.2 | 66.8 | — |
| Polymerization Example 7 | A-7 | 50 | <0.1 | 7,200 | 2.00 | 71.1 | 28.9 | — |
| Polymerization Example 8 | A-8 | 45 | <0.1 | 4,000 | 1.80 | 85.3 | 14.7 | — |
| Polymerization Example 9 | A-9 | 78 | <0.1 | 8,000 | 1.63 | 70.1 | 14.1 | 15.8 |
| Polymerization Example 10 | A-10 | 75 | <0.1 | 6,800 | 1.65 | 79.1 | 15.6 | 5.3 |
| Polymerization Example 11 | A-11 | 66 | <0.1 | 7,000 | 1.60 | 70.5 | 29.5 | — |
| Polymerization Example 12 | A-12 | 60 | <0.1 | 7,200 | 2.00 | 71.1 | 28.9 | — |
| Polymerization Example 13 | A-13 | 60 | <0.1 | 4,000 | 1.80 | 85.3 | 14.7 | — |

The results of $^{13}$C-NMR analysis of A-1 to A-13 were as follows.

A-1: Peak originating from monomer (M-1) is at 95 ppm and has an area of 2.067, peak originating from monomer (M-3) is at 85 to 90 ppm and has an area of 1.000, and M-1/M-3=67.4/32.6 (mol %)

A-2: Peak originating from monomer (M-2) at 95 ppm: 1.650, peak originating from monomer (M-3) at 85 to 90 ppm: 1.225, and M-2/M-3=57.4/42.6 (mol %)

A-3: Peak originating from monomer (M-1) at 95 ppm: 2.834, peak originating from monomer (M-4) at 85 to 90 ppm: 1.286, and M-1/M-4=68.8/31.2 (mol %)

A-4: Peak originating from monomer (M-1) at 95 ppm is 2.672, peaks originating from monomer (M-5) at 110 to 120 ppm and at 60 to 70 ppm are respectively 1.000 and 1.117, and M-1/M-5=71.6/28.4 (mol %)

A-5: Peak originating from monomer (M-1) at 95 ppm is 5.899, peak originating from monomer (M-5) at 110 to 120 ppm is 1.000, and M-1/M-5=85.5/14.5 (mol %)

A-6: Peak originating from monomer (M-1) at 95 ppm is 1.012, peaks originating from monomer (M-5) at 110 to 120 ppm and at 60 to 70 ppm are respectively 1.946 and 2.130, and M-1/M-5=33.2/66.8 (mol %)

A-7: Peak originating from monomer (M-1) at 95 ppm is 2.487, peaks originating from monomer (M-6) at 100 to 130 ppm and at 60 to 70 ppm are respectively 2.045 and 1.000, and M-1/M-6=71.1/28.9 (mol %)

A-8: Peak originating from monomer (M-1) at 95 ppm is 6.600, peak originating from monomer (M-5) at 60 to 70 ppm is 1.139, and M-1/M-5=85.3/14.7 (mol %)

A-9: Peak originating from monomer (M-1) at 95 ppm is 4.989, a peak originating from monomer (M-5) at 110 to 120 ppm is 1.000, peak originating from monomer (M-7) is 1.124, and M-1/M-5/M-7=70.1/14.1/15.8 (mol %)

A-10: Peak originating from monomer (M-1) at 95 ppm is 15.905, a peak originating from monomer (M-5) at 110 to 120 ppm is 2.961, peak originating from monomer (M-7) at 85 ppm is 1.000, and M-1/M-5/M-7=79.1/15.6/5.3 (mol %)

A-11: Peak originating from monomer (M-1) at 95 ppm is 5.343, peak originating from monomer (M-10) at 60 ppm is 2.300, and M-1/M-10=70.5/29.5 (mol %)

A-12: Peak originating from monomer (M-1) at 95 ppm is 5.343, peak originating from monomer (M-10) at 60 ppm is 2.300, and M-1/M-10=70.5/29.5 (mol %)

A-13: Peak originating from monomer (M-1) at 95 ppm is 6.600, peak originating from monomer (M-5) at 60 to 70 ppm is 1.139, and M-1/M-5=85.3/14.7 (mol %)

<Synthesis of Resin (B-1)>

A monomer solution was prepared by dissolving 53.93 g (50 mol %) of the monomer (M-7), 35.38 g (40 mol %) of the monomer (M-1), and 10.69 g (10 mol %) of the monomer (M-8) in 200 g of 2-butanone, and further adding 5.58 g of dimethyl 2,2'-azobis(2-methylpropionate). On the other hand, 100 g of 2-butanone was charged into a 500-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (74 g, yield 74%).

The polymer was a copolymer having Mw of 6,900, Mw/Mn=1.70 and mol % ratio of the repeating units originating from the monomer (M-7), the monomer (M-1) and the monomer (M-8) determined by $^{13}$C-NMR analysis of 53.0:37.2:9.8 (mol %). This polymer is indicated as resin (B-1). The content of low-molecular weight compounds originating from the monomers in the resin (B-1) was 0.03% by weight based on 100% by weight of the polymer.

<Synthesis of Resin (B-2)>

A monomer solution was prepared by dissolving 55.44 g (50 mol %) of the monomer (M-7), 33.57 g (40 mol %) of the monomer (M-9), and 10.99 g (10 mol %) of the monomer (M-8) in 200 g of 2-butanone, and further adding 5.74 g of dimethyl 2,2'-azobis(2-methylpropionate). On the other hand, 100 g of 2-butanone was charged into a 500-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (72 g, yield 72%).

The polymer was a copolymer having Mw of 9,100, Mw/Mn=1.56 and mol % ratio of the repeating units originating from the monomer (M-7), the monomer (M-9) and the monomer (M-8) determined by $^{13}$C-NMR analysis of 52.2:38.1:9.7 (mol %). This polymer is indicated as resin (B-2). The content of low-molecular weight compounds originating from the monomers in the resin (B-2) was 0.02% by weight based on 100% by weight of the polymer.

<Synthesis of Resin (B-3)>

A monomer solution was prepared by dissolving 41.32 g (41 mol %) of the monomer (M-7), 44.63 g (42 mol %) of the monomer (M-11), and 14.05 g (17 mol %) of the monomer (M-12) in 200 g of 2-butanone, and further adding 5.74 g of dimethyl 2,2'-azobis(2-methylpropionate). On the other hand, 100 g of 2-butanone was charged into a 500-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (72 g, yield 72%).

The polymer was a copolymer having Mw of 5,900, Mw/Mn=1.60 and mol % ratio of the repeating units originating from the monomer (M-7), the monomer (M-11) and the monomer (M-12) determined by $^{13}$C-NMR analysis of 41.1:42.3:16.6 (mol %). This polymer is indicated as resin (B-3). The content of low-molecular weight compounds originating from the monomers in the resin (B-3) was 0.1% or less by weight based on 100% by weight of the polymer.

<Synthesis of Resin (B-4)>

A monomer solution was prepared by dissolving 39.36 g (40 mol %) of the monomer (M-7), 5.65 g (7 mol %) of the monomer (M-1), and 54.99 g (53 mol %) of the monomer (M-11) in 200 g of 2-butanone, and further adding 6.54 g of dimethyl 2,2'-azobis(isobutylonitrile). On the other hand, 100 g of 2-butanone was charged into a 500-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (75 g, yield 75%).

The polymer was a copolymer having Mw of 3,700, Mw/Mn=1.40 and mol % ratio of the repeating units originating from the monomer (M-7), the monomer (M-1) and the monomer (M-11) determined by $^{13}$C-NMR analysis of 41.1:6.9:52.0 (mol %). This polymer is indicated as resin (B-4). The content of low-molecular weight compounds originating from the monomers in the resin (B-4) was 0.1% or less by weight based on 100% by weight of the polymer.

<Synthesis of Resin (B-5)>

A monomer solution was prepared by dissolving 47.19 g (47 mol %) of the monomer (M-7), 11.53 g (14 mol %) of the monomer (M-1), and 41.29 g (39 mol %) of the monomer (M-11) in 200 g of 2-butanone, and further adding 4.08 g of dimethyl 2,2'-azobis(isobutylonitrile). On the other hand, 100 g of 2-butanone was charged into a 1,000-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (75 g, yield 75%).

The polymer was a copolymer having Mw of 5,900, Mw/Mn=1.50 and mol % ratio of the repeating units originating from the monomer (M-7), the monomer (M-1) and the monomer (M-11) determined by $^{13}$C-NMR analysis of 46.2:14.6:39.2 (mol %). This polymer is indicated as resin (B-5). The content of low-molecular weight compounds originating from the monomers in the resin (B-5) was 0.1% or less by weight based on 100% by weight of the polymer.

<Synthesis of Resin (B-6)>

A monomer solution was prepared by dissolving 38.74 g (40 mol %) of the monomer (M-7) and 61.26 g (60 mol %) of the monomer (M-11) in 200 g of 2-butanone, and further adding 4.08 g of dimethyl 2,2'-azobis(isobutylonitrile). On the other hand, 100 g of 2-butanone was charged into a 1,000-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (73 g, yield 73%).

The polymer was a copolymer having Mw of 5,200, Mw/Mn=1.67 and mol % ratio of the repeating units originating from the monomer (M-11) and the monomer (M-7) determined by $^{13}$C-NMR analysis of 59.5:40.5 (mol %). This polymer is indicated as resin (B-6). The content of low-molecular weight compounds originating from the monomers in the resin (B-6) was 0.1% or less by weight based on 100% by weight of the polymer.

<Synthesis of Resin (B-7)>

A monomer solution was prepared by dissolving 31.30 g (30 mol %) of the monomer (M-7), 29.09 g (34 mol %) of the monomer (M-1), and 39.61 g (36 mol %) of the monomer (M-11) in 200 g of 2-butanone, and further adding 4.08 g of dimethyl 2,2'-azobis(isobutylonitrile). On the other hand, 100 g of 2-butanone was charged into a 1,000-mL three-necked flask and nitrogen was purged for 30 minutes. After purging nitrogen to the flask, the content was heated to 80° C. while stirring and the above monomer solution was added dropwise using a dropping funnel over three hours. The initiation of the addition was set to a polymerization starting time and polymerization was carried out for six hours. After the polymerization, the polymer solution was cooled with water to a temperature of 30° C. or lower and was poured into 2,000 g of methanol. A white precipitate produced was collected by filtration. The white powder collected by filtration was washed twice with 400 g of methanol in a slurry state, filtered again, and dried at 50° C. for 17 hours to obtain a polymer in the form of white powder (72 g, yield 72%).

The polymer was a copolymer having Mw of 5,000, Mw/Mn=1.65 and mol % ratio of the repeating units originating from the monomer (M-7), the monomer (M-1) and the monomer (M-11) determined by $^{13}$C-NMR analysis of 30.4:33.8:35.8 (mol %). This polymer is indicated as resin (B-7). The content of low-molecular weight compounds originating from the monomers in the resin (B-7) was 0.1% or less by weight based on 100% by weight of the polymer.

<Preparation of Radiation-Sensitive Resin Compositions>

The radiation-sensitive resin compositions for Examples 1 to 34 and Comparative Examples 1 and 2 were prepared by mixing the fluorine-containing polymer (A), resin (B), acid generator (C), nitrogen-containing compound (D) and solvent (E) according to proportions shown in Tables 3 to 5.

TABLE 3

| | Polymer (A) (part) | Resin (B) (part) | Acid generator (C) (part) | Nitrogen-containing compound (D) (part) | Solvent (E) (part) |
|---|---|---|---|---|---|
| Example 1 | A-1 (5) | B-1 (95) | C-1 (1.5) C-2 (6.0) | D-1 (0.65) | E-1 (1400) E-2 (30) |
| Example 2 | A-2 (5) | B-1 (95) | C-1 (1.5) C-2 (6.0) | D-1 (0.65) | E-1 (1400) E-2 (30) |
| Example 3 | A-3 (5) | B-1 (95) | C-1 (1.5) C-2 (6.0) | D-1 (0.65) | E-1 (1400) E-2 (30) |
| Example 4 | A-4 (5) | B-1 (95) | C-1 (1.5) C-2 (6.0) | D-1 (0.65) | E-1 (1400) E-2 (30) |
| Example 5 | A-5 (5) | B-1 (95) | C-1 (1.5) C-2 (6.0) | D-1 (0.65) | E-1 (1400) E-2 (30) |
| Example 6 | A-6 (5) | B-1 (95) | C-1 (1.5) C-2 (6.0) | D-1 (0.65) | E-1 (1400) E-2 (30) |
| Example 7 | A-7 (5) | B-1 (95) | C-1 (1.5) C-2 (6.0) | D-1 (0.65) | E-1 (1400) E-2 (30) |
| Example 8 | A-8 (5) | B-1 (95) | C-1 (1.5) C-2 (6.0) | D-1 (0.65) | E-1 (1400) E-2 (30) |
| Example 9 | A-9 (5) | B-1 (95) | C-1 (1.5) C-2 (6.0) | D-1 (0.65) | E-1 (1400) E-2 (30) |
| Example 10 | A-5 (5) | B-1 (95) | C-1 (1.5) C-2 (6.0) | D-1 (0.65) | E-1 (1400) E-2 (30) |
| Example 11 | A-5 (5) | B-1 (95) | C-1 (1.5) C-2 (6.0) | D-1 (0.65) | E-1 (980) E-4 (420) |
| Example 12 | A-5 (5) | B-1 (95) | C-1 (1.5) C-2 (6.0) | D-1 (0.65) | E-1 (980) E-3 (420) |
| Example 13 | A-10 (5) | B-1 (95) | C-1 (1.5) C-2 (6.0) | D-1 (0.65) | E-1 (1400) E-2 (30) |

TABLE 4

| | Polymer (A) (part) | Resin (B) (part) | Acid generator (C) (part) | Nitrogen-containing compound (D) (part) | Solvent (E) (part) |
|---|---|---|---|---|---|
| Example 14 | A-8 (5) | B-2 (95) | C-4 (6.5) C-5 (2.0) | D-1 (1.10) | E-1 (1400) E-2 (30) E-4 (600) |
| Example 15 | A-11 (5) | B-2 (95) | C-4 (6.5) C-5 (2.0) | D-1 (1.10) | E-1 (1400) E-2 (30) E-4 (600) |
| Example 16 | A-12 (5) | B-3 (85) B-5 (15) | C-1 (4.0) C-2 (4.0) | D-1 (1.10) | E-1 (1400) E-2 (30) E-4 (600) |
| Example 17 | A-12 (5) | B-3 (85) B-5 (15) | C-1 (2.0) C-2 (6.0) | D-1 (1.10) | E-1 (1400) E-2 (30) E-4 (600) |
| Example 18 | A-12 (5) | B-3 (30) B-5 (70) | C-1 (4.0) C-2 (5.0) | D-1 (1.10) | E-1 (1400) E-2 (30) E-4 (600) |
| Example 19 | A-12 (5) | B-3 (30) B-5 (70) | C-6 (4.0) C-2 (5.0) | D-1 (1.10) | E-1 (1400) E-2 (30) E-4 (600) |
| Example 20 | A-12 (5) | B-5 (100) | C-1 (7.0) C-2 (2.0) | D-1 (1.10) | E-1 (1400) E-2 (30) E-4 (600) |
| Example 21 | A-12 (5) | B-3 (30) B-4 (70) | C-1 (4.0) C-2 (5.0) | D-1 (1.10) | E-1 (1400) E-2 (30) E-4 (600) |
| Example 22 | A-12 (5) | B-3 (40) B-6 (60) | C-6 (4.0) C-2 (5.0) | D-1 (1.10) | E-1 (1400) E-2 (30) E-4 (600) |
| Example 23 | A-12 (5) | B-3 (30) B-4 (70) | C-1 (7.0) C-2 (2.0) | D-1 (1.10) | E-1 (1400) E-2 (30) E-4 (600) |

TABLE 4-continued

| | Polymer (A) (part) | Resin (B) (part) | Acid generator (C) (part) | Nitrogen-containing compound (D) (part) | Solvent (E) (part) |
|---|---|---|---|---|---|
| Example 24 | A-12 (5) | B-3 (30) B-4 (70) | C-1 (7.0) C-5 (2.0) | D-1 (1.10) | E-1 (1400) E-2 (30) E-4 (600) |
| Example 25 | A-13 (5) | B-5 (100) | C-1 (7.0) C-2 (2.0) | D-1 (1.10) | E-1 (140) E-2 (30) E-4 (600) |

TABLE 5

| | Polymer (A) (part) | Resin (B) (part) | Acid generator (C) (part) | Nitrogen-containing compound (D) (part) | Solvent (E) (part) |
|---|---|---|---|---|---|
| Example 26 | A-12 (5) | B-5 (100) | C-1 (3.0) C-2 (2.0) C-6 (4.5) | D-1 (1.10) | E-1 (1400) E-2 (30) E-4 (600) |
| Example 27 | A-12 (5) | B-5 (100) | C-1 (7.0) C-2 (2.0) | D-1 (1.10) | E-1 (1400) E-2 (30) E-4 (600) |
| Example 28 | A-12 (5) | B-6 (100) | C-7 (2.0) C-2 (4.0) C-5 (2.0) | D-1 (1.10) | E-1 (1400) E-2 (30) E-4 (600) |
| Example 29 | A-12 (5) | B-6 (100) | C-7 (2.0) C-2 (6.0) | D-1 (1.10) | E-1 (1400) E-2 (30) E-4 (600) |
| Example 30 | A-12 (5) | B-6 (100) | C-7 (4.0) C-1 (3.0) | D-1 (1.10) | E-1 (1400) E-2 (30) E-4 (600) |
| Example 31 | A-13 (5) | B-1 (100) | C-1 (1.5) C-2 (6.0) | D-1 (1.10) | E-1 (1400) E-2 (30) E-4 (600) |
| Example 32 | A-12 (5) | B-1 (100) | C-1 (1.5) C-2 (6.0) | D-1 (1.10) | E-1 (1400) E-2 (30) E-4 (600) |
| Example 33 | A-12 (5) | B-7 (100) | C-7 (7.5) | D-1 (1.10) | E-1 (1400) E-2 (30) E-4 (600) |
| Example 34 | A-12 (5) | B-7 (100) | C-6 (7.0) | D-1 (1.10) | E-1 (1400) E-2 (30) E-4 (600) |
| Comparative Example 1 | — | B-1 (100) | C-1 (1.5) C-2 (6.0) | D-1 (0.65) | E-1 (1400) E-2 (30) E-4 (600) |
| Comparative Example 2 | — | B-2 (100) | C-4 (6.5) C-5 (2.0) | D-1 (1.10) | E-1 (1400) E-2 (30) E-4 (600) |

Details of the acid generator (C), nitrogen-containing compound (D) and solvent (E) shown in Tables 3 to 5 are as follows. In the Tables, "part" is based on weight unless otherwise indicated.

<Acid Generator (C)>

(C-1): Triphenylsulfonium nonafluoro-n-butanesulfonate
(C-2): 1-(4-n-butoxynaphthyl)tetrahydrothiophenium perfluoro-n-butanesulfonate
(C-3) Compound represented by the following formula

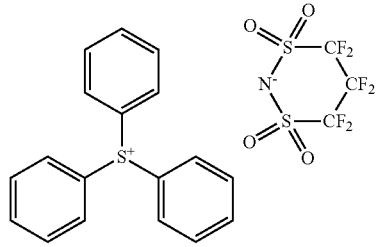 [SMILES: c1ccc([S+](c2ccccc2)c2ccccc2)cc1 ; O=S1(=O)[N-]S(=O)(=O)C(F)(F)C(F)(F)C1(F)F]

(C-4): Triphenylsulfonium 2-(bicyclo[2.2.1]hept-2'-yl)-1,1,2,2-tetrafluoroethanesulfonate
(C-5): 1-(4-n-butoxynaphthyl)tetrahydrothiophenium 2-(bicyclo[2.2.1]hept-2'-yl)-1,1,2,2-tetrafluoroethanesulfonate
(C-6): 4-cyclohexylphenyldiphenylsulfonium nonafluoro-n-butanesulfonate
(C-7): Triphenylsulfonium 2-(bicyclo[2.2.1]hept-2'-yl)-1,1-difluoroethanesulfonate <Nitrogen-Containing Compound (D)>
(D-1): N-t-butoxycarbonyl-4-hydroxypiperidine
<Solvent (E)>
(E-1): Propylene glycol monomethyl ether acetate
(E-2): γ-butyrolactone
(E-3): Ethyl lactate
(E-4): Cyclohexanone <Evaluation of Radiation-Sensitive Resin Compositions>

The radiation-sensitive compositions according to Examples 1 to 13 and Examples 21 to 34 and Comparative Example 1 were subjected to evaluation (1) to (4) indicated below. Results of the evaluations are shown in Tables 6 and 7.

In addition, the radiation-sensitive compositions according to Examples 14 and 15, and Comparative Example 2 were subjected to evaluation (1), (2) and (5) to (8) below. Results of the evaluations are shown in Table 8.

Further, the radiation-sensitive compositions according to Examples 16 to 20 were subjected to evaluation (1), (2) and (9) to (12) below. Results of the evaluations are shown in Table 9.

The evaluation methods were as follows.

(1) Measurement of Eluted Amount

A 30 cm×30 cm square silicone rubber sheet 4 with a thickness of 1.0 mm (manufactured by Kureha Elastomer Co., Ltd.), of which the center was cut out in the form of a disk with a diameter of 11.3 cm was superposed on the center of an 8-inch silicon wafer 3 which was previously treated with HMDS (hexamethyldisilazane) 31 at 100° C. for 60 seconds using "CLEAN TRACK ACT 8" (manufactured by Tokyo Electron, Ltd.), as shown in FIG. 1. Subsequently, the cutout area at the center of the silicone rubber sheet was filled with 10 mL of ultra pure water 5 using a 10-mL transfer pipette.

After that, a silicon wafer 6 having an underlayer antireflection film 61 with a thicknesses of 77 nm ("ARC29A" manufactured by Bruwer Science) formed using "CLEAN TRACK ACT 8", and a resist film 62 with a thicknesses of 205 nm formed by applying resist compositions shown in Tables 3 and 5 on the underlayer antireflection film 61 by spin coating using "CLEAN TRACK ACT 8" and baking at 115° C. for 60 seconds, was superposed on the above-mentioned silicone rubber sheet 14 in a manner such that the resist coating surface comes in contact with the above-mentioned ultra pure water 5, and the ultra pure water 5 does not leak from the silicone rubber sheet 4.

10 seconds were holded as it is, and then the above-mentioned 8-inch silicon wafer 6 was removed and the ultra pure water 5 was collected using a glass pipette for use as a sample for analysis. The recovery rate of the ultra pure water after the experiment was 95% or more.

Next, the collected ultra pure water was subjected to a measurement of LC-MS using a liquid chromatograph mass spectrometer having "SERIES 1100" manufactured by AGILENT Corp. for LC section, and "Mariner" manufactured by Perseptive Biosystems, Inc. for MS section under the following conditions to obtain the peak intensity of an anion part of the acid generator. In this instance, peak intensities of the aqueous solutions containing the radiation-sensitive acid generator at concentrations of 1 ppb, 10 ppb, and 100 ppb were measured under the above conditions to prepare a calibration curve. The eluted amount was calculated from the above peak intensity using this calibration curve. In the same manner, the peak intensities of aqueous solutions of the acid diffusion controller at concentrations of 1 ppb, 10 ppb, and 100 ppb were measured under the same conditions to prepare a calibration curve. The eluted amount of the acid diffusion controller was calculated from the above peak intensity using this calibration curve. The evaluation criteria were as "Good" when the eluted amount was $5.0 \times 10^{-12}$ mol/cm$^2$/sec or more, and as "Bad" when the amount was less than that.

(Column Conditions)
Column: One column of "CAPCELL PAK MG" manufactured by Shiseido Co., Ltd.
Flow rate: 0.2 mL/min.
Eluate: A 3:7 mixture of water and methanol, with 0.1% by weight of formic acid added
Measurement temperature: 35° C.

(2) Measurement of Receding Contact Angle

After fabricating a substrate (wafer) wherein a film was formed with the radiation-sensitive resin composition using "DSA-10" manufactured by KRUS, it was promptly measured at room temperature (23° C.) and humidity of 45% under atmospheric pressure according to the following procedure.
<1> Adjust the wafer stage position,
<2> set the wafer on a stage,
<3> charge water to a needle,
<4> minutely adjust the needle position,
<5> inject water from the needle onto the wafer to form a 25-μL waterdrop,
<6> withdraw the needle from the waterdrop,
<7> replace the needle again to the position adjusted in <4>,
<8> suck up water from the needle for 90 seconds at a rate of 10 μL/min and, at the same time, measure the contact angle once every second (total of 90 times), and
<9> starting from the time when the measured contact angle values are stabilized, the contact angles at 20 points are measured and averaged to obtain the receding contact angle.

(3) Sensitivity (i)

A 12-inch silicon wafer on which an underlayer antireflection film with a thickness of 77 nm ("ARC29A" manufactured by Bruwer Science) had been formed was used as a substrate. For fabricating this underlayer antireflection film, "CLEAN TRACK ACT 8" (manufactured by Tokyo Electron Ltd.) was used.

Subsequently, the resin compositions shown in Tables 3 to 5 (Examples 1 to 13, Examples 21 to 34, and Comparative Example 1) were subjected to spin coating onto the above-mentioned substrate using the "CLEAN TRACK ACT 8" and baking (PB) under the conditions shown in Tables 6 and 7 to form resist films with a thickness of 205 nm. The resist films were exposed to radiation through a patterned mask using an ArF excimer laser exposure apparatus ("NSR S306C" manufactured by Nicon Corp., illuminating conditions: NA=0.78, sigma=0.93/0.69). After that, PEB was carried out under the conditions shown in Tables 6 and 7. The resist film was developed at 23° C. for 30 seconds in a tetramethylammonium hydroxide aqueous solution at a concentration of 2.38% by weight, washed with water, and dried to form a positive-tone resist pattern. An optimum exposure dose at which a 1:1 line-and-space (1L1S) pattern with a line width of 90 nm was formed was taken as sensitivity (i). A scanning electron microscope ("S-9380" manufactured by Hitachi High-Technologies Corporation) was used for the measurement.

(4) Cross-Sectional Shape (i) of Pattern

Figure 2:
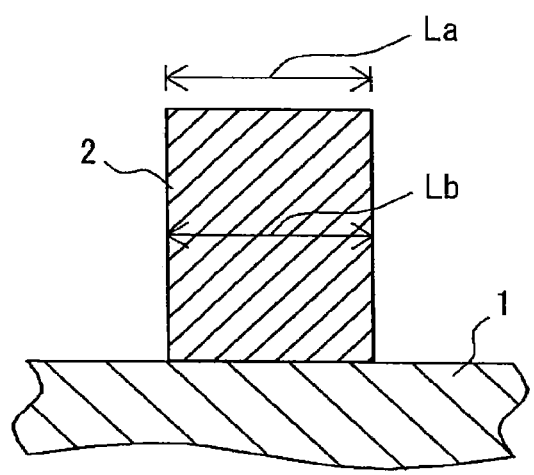
FIG. 2 is a cross-sectional view of a line and space pattern.

The cross-sectional shape of a line-and-space pattern with a line width of 90 nm obtained in (3) above was inspected using "S-4800" manufactured by Hitachi High-Technologies Corporation to measure the line width Lb at the middle of the resist pattern and the line width La at the upper part of the film according to FIG. 2. The criteria was determined as "Good" when 0.9≤(La−Lb)/Lb≤1.1 was satisfied, and otherwise as "Bad".

(5) Sensitivity (ii) (Liquid Immersion Lithography)

A 12-inch silicon wafer on which an underlayer antireflection film with a thickness of 77 nm ("ARC29A" manufactured by Bruwer Science) had been formed was used as a substrate. For fabricating this underlayer antireflection film, "CLEAN TRACK ACT 12" (manufactured by Tokyo Electron Ltd.) was used.

Subsequently, the resin compositions shown in Tables 4 and 5 (Examples 14 and 15, and Comparative Example 2) were subjected to spin coating onto the above-mentioned substrate using the "CLEAN TRACK ACT 12" and baking (PB) under the conditions shown in Table 8 to form resist films with a thickness of 120 nm. The resist films were exposed to radiation through a patterned mask under the conditions of NA=0.85, $\sigma_0/\sigma_1$=0.96/0.7 and dipole illumination using an ArF excimer laser liquid immersion exposure apparatus ("ASML AT1250i" manufactured by ASML). Pure water was used as an immersion liquid medium between the resist surface and the lens of the liquid immersion lithographic instrument. After that, PEB was carried out under the conditions shown in Table 8. The resist film was developed at 23° C. for 60 seconds in a tetramethylammonium hydroxide aqueous solution at a concentration of 2.38% by weight, washed with water, and dried to form a positive-tone resist pattern. An optimum exposure dose at which a 1:1 line-and-space (1L1S) pattern with a line width of 65 nm was formed was taken as sensitivity (ii). A scanning electron microscope ("S-9380" manufactured by Hitachi High-Technologies Corporation) was used for the measurement.

(6) Depth of Focus (DOF)

A line-and-space pattern (1L1S) with a line width of 65 nm was formed in the same manner as in (5) above. In this instance, the exposure dose required for forming the line-and-space pattern having 1:1 line width, which is the depth of focus performance (DOF performance) at the sensitivity (optimal exposure dose) shown in Table 8, was measured using scanning electron microscope ("S-9380" manufactured by Hitachi High-Technologies Corporation).

(7) Cross-Sectional Shape (ii) of Pattern (Liquid Immersion Lithography)

The cross-sectional shape of a line-and-space pattern with a line width of 65 nm obtained in the same manner as (5) above was inspected using "S-4800" manufactured by Hitachi High-Technologies Corporation to measure the line width Lb at the middle of the resist pattern and the line width La at the upper part of the film according to FIG. 2. The criteria was determined as "Good" when 0.9≤(La−Lb)/Lb≤1.1 was satisfied, and otherwise as "Bad".

(8) Number of Defects (Number of Small Bridge-Type Defects and Number of Watermark Defects)

A 12-inch silicon wafer on which an underlayer antireflection film with a thickness of 77 nm ("ARC29A" manufactured by Bruwer Science) had been formed was used as a substrate. For fabricating this underlayer antireflection film, "CLEAN TRACK ACT 12" (manufactured by Tokyo Electron Ltd.) was used.

Subsequently, the resin compositions shown in Tables 4 and 5 (Examples 14 and 15, and Comparative Example 2) were subjected to spin coating onto the above-mentioned substrate using the "CLEAN TRACK ACT 12" and baking (PB) under the conditions shown in Table 8 to form resist films with a thickness of 150 nm. The resist films were exposed to radiation through a patterned mask under the conditions of NA=0.85, $\sigma_0/\sigma_1$=0.96/0.76 and annular illumination using an ArF excimer laser liquid immersion exposure apparatus ("ASML AT1250i" manufactured by ASML). Pure water was used as an immersion liquid medium between the resist surface and the lens of the liquid immersion lithographic instrument. After that, PEB was carried out under the conditions shown in Table 8. The resist film was developed at 23° C. for 60 seconds in a tetramethylammonium hydroxide aqueous solution at a concentration of 2.38% by weight, washed with water, and dried to form a positive-tone resist pattern. An optimum exposure dose at which a 1:1 line-and-space (1L1S) pattern with a line width of 100 nm was formed was taken as sensitivity. A scanning electron microscope ("S-9380" manufactured by Hitachi High-Technologies Corporation) was used for the measurement.

After that, the number of defects on the line-and-space (1L1S) pattern with a line width of 100 nm was measured using "KLA2351" manufactured by KLA-Tencor Corp. In addition, the defects measured by "KLA2351" were observed using a scanning electron microscope ("S-9380" manufactured by Hitachi High Technologies Corp.) to classify the defects into small bridge-type defects and watermark defects which is thought to be originating from exposure to ArF excimer laser by liquid immersion lithography. The results were shown in Table 8. The small bridge-type defect is a type of defect that can be observed in normal exposure to ArF excimer laser without filling the space between the resist surface and the lens.

(9) Sensitivity (iii)

A 12-inch silicon wafer on which an underlayer antireflection film with a thickness of 77 nm ("ARC29A" manufactured by Bruwer Science) had been formed was used as a substrate. For fabricating this underlayer antireflection film, "CLEAN TRACK ACT 12" (manufactured by Tokyo Electron Ltd.) was used.

Subsequently, the resin compositions shown in Table 4 (Examples 16 to 20) were subjected to spin coating onto the above-mentioned substrate using the "CLEAN TRACK ACT 12" and baking (PB) under the conditions shown in Table 9 to form resist films with a thickness of 120 nm. The resist films were exposed to radiation through a patterned mask under the conditions of NA=0.85, $\sigma_0/\sigma_1$=0.96/0.76 and dipole illumination using an ArF excimer laser liquid immersion exposure apparatus ("ASML AT1250i" manufactured by ASML). Pure water was used as an immersion liquid medium between the resist surface and the lens of the liquid immersion lithographic instrument. After that, PEB was carried out under the conditions shown in Table 9. The resist film was developed at 23° C. for 60 seconds in a tetramethylammonium hydroxide aqueous solution at a concentration of 2.38% by weight, washed with water, and dried to form a positive-tone resist pattern. An optimum exposure dose at which a 1:1 line-and-space (1L1S) pattern with a line width of 75 nm was formed was taken as sensitivity. A scanning electron microscope ("S-9380" manufactured by Hitachi High-Technologies Corporation) was used for the measurement.

(10) Cross-Sectional Shape (iii) of Pattern

The cross-sectional shape of a line-and-space pattern with a line width of 75 nm obtained in (9) above was inspected using "S-4800" manufactured by Hitachi High-Technologies Corporation to measure the line width Lb at the middle of the resist pattern and the line width La at the upper part of the film according to FIG. 2. The criteria was determined as "Good" when 0.9≤(La−Lb)/Lb≤1.1 was satisfied, and otherwise as "Bad".

(11) Exposure Margin (EL)

A 12-inch silicon wafer on which an underlayer antireflection film with a thickness of 77 nm ("AR46" manufactured by Rohm and Haas) had been formed was used as a substrate. For fabricating this underlayer antireflection film, "CLEAN TRACK ACT 8" (manufactured by Tokyo Electron Ltd.) was used.

Subsequently, the resin compositions shown in Table 4 (Examples 16 to 20) were subjected to spin coating onto the above-mentioned substrate using the "CLEAN TRACK ACT 8" (manufactured by Tokyo Electron Ltd.) and baking (PB) under the conditions shown in Table 9 to form resist films with a thickness of 160 nm. The resist films were exposed to radiation through a patterned mask under the conditions of NA=0.78, $\sigma_0/\sigma_1$=0.90/0.47 and dipoleX illumination using an ArF excimer laser exposure apparatus ("Nikon NSR S306C" manufactured by Nicon Corp.). After that, PEB was carried out under the conditions shown in Table 9. The resist film was developed at 23° C. for 60 seconds in a tetramethylammonium hydroxide aqueous solution at a concentration of 2.38% by weight, washed with water, and dried to form a positive-tone resist pattern. The exposure margin (EL) was determined by dividing the difference of the exposure dose at which a pattern with a line width of 75 nm−10% was formed and the exposure dose at which a pattern with a line width of 75 nm+10% was formed by the exposure dose at which a pattern with a line width of 75 nm, in the line-and-space (1L1S) pattern-forming experiment with a line width of 75 nm. The exposure margin (EL) was evaluated as "Bad" when the value was less than 9%, and as "Good" when 10% or more. A scanning electron microscope ("S-9380" manufactured by Hitachi High-Technologies Corporation) was used for the measurement.

(12) Collapsing Margin

The collapsing margin was determined by dividing the maximum exposure dose that can maintain the line at the center of the pattern without collapsing by the exposure dose for forming a 1:1 line-and-space (1L1S) pattern with a line width of 75 nm, in the line-and-space (1L1S) pattern-forming experiment with a line width of 75 nm. The collapsing margin was evaluated as "Bad" when the resulting value was 1.1 or less, and as "Good" when the value was 1.2 or more. A scanning electron microscope ("S-9380" manufactured by Hitachi High-Technologies Corporation) was used for the measurement.

TABLE 6

| | Bake (temperature/time) | PEB (temperature/time) | Elution | Receding contact angle (degree) | Sensitivity (i) (mJ/cm$^2$) | Patten shape (i) |
|---|---|---|---|---|---|---|
| Example 1 | 120° C./60 s | 115° C./60 s | Good | 90.1 | 22 | Good |
| Example 2 | 120° C./60 s | 115° C./60 s | Good | 73.1 | 22 | Good |
| Example 3 | 120° C./60 s | 115° C./60 s | Good | 85.3 | 22 | Good |
| Example 4 | 120° C./60 s | 115° C./60 s | Good | 89.4 | 22 | Good |
| Example 5 | 120° C./60 s | 115° C./60 s | Good | 86.7 | 22 | Good |
| Example 6 | 120° C./60 s | 115° C./60 s | Good | 94.0 | 22 | Good |
| Example 7 | 120° C./60 s | 115° C./60 s | Good | 84.8 | 22 | Good |
| Example 8 | 120° C./60 s | 115° C./60 s | Good | 86.0 | 22 | Good |
| Example 9 | 120° C./60 s | 115° C./60 s | Good | 80.0 | 22 | Good |
| Example 10 | 120° C./60 s | 115° C./60 s | Good | 86.7 | 30 | Good |
| Example 11 | 120° C./60 s | 115° C./60 s | Good | 86.7 | 22 | Good |
| Example 12 | 120° C./60 s | 115° C./60 s | Good | 86.7 | 22 | Good |
| Example 13 | 120° C./60 s | 115° C./60 s | Good | 84.3 | 22 | Good |

TABLE 7

| | Bake (temperature/time) | PEB (temperature/time) | Elution | Receding contact angle (degree) | Sensitivity (i) (mJ/cm$^2$) | Patten shape (i) |
|---|---|---|---|---|---|---|
| Example 21 | 100° C./60 s | 110° C./60 s | Good | 80.0 | 52 | Good |
| Example 22 | 100° C./60 s | 110° C./60 s | Good | 80.0 | 46 | Good |
| Example 23 | 110° C./60 s | 110° C./60 s | Good | 80.0 | 54 | Good |
| Example 24 | 110° C./60 s | 110° C./60 s | Good | 80.0 | 45 | Good |
| Example 25 | 115° C./60 s | 115° C./60 s | Good | 86.0 | 37 | Good |
| Example 26 | 115° C./60 s | 115° C./60 s | Good | 80.0 | 52 | Good |
| Example 27 | 115° C./60 s | 115° C./60 s | Good | 81.0 | 49 | Good |
| Example 28 | 110° C./60 s | 115° C./60 s | Good | 80.0 | 33 | Good |
| Example 29 | 100° C./60 s | 115° C./60 s | Good | 80.0 | 37 | Good |
| Example 30 | 100° C./60 s | 115° C./60 s | Good | 80.0 | 37 | Good |
| Example 31 | 130° C./60 s | 120° C./60 s | Good | 86.0 | 33 | Good |
| Example 32 | 130° C./60 s | 120° C./60 s | Good | 83.0 | 33 | Good |
| Example 33 | 120° C./60 s | 105° C./60 s | Good | 80.0 | 43 | Good |
| Example 34 | 110° C./60 s | 105° C./60 s | Good | 80.0 | 35 | Good |
| Comparative Example 1 | 120° C./60 s | 115° C./60 s | Bad | 58.0 | 22 | Good |

TABLE 8

| | Bake (temperature/time) | PEB (temperature/time) | Elution | Receding contact angle (degree) | Sensitivity (ii) (mJ/cm$^2$) | Depth of focus (nm) | Patten shape (ii) | Defect | |
|---|---|---|---|---|---|---|---|---|---|
| | | | | | | | | Bridge | Watermark |
| Example 14 | 100° C./60 s | 130° C./60 s | Good | 86.7 | 24 | 500 | Good | 37 | 2 |
| Example 15 | 100° C./60 s | 130° C./60 s | Good | 83.3 | 25 | 500 | Good | 28 | 2 |
| Comparative Example 2 | 100° C./60 s | 130° C./60 s | Bad | 57.6 | 24 | 500 | Good | 37 | 28 |

TABLE 9

| | Bake (temperature/time) | PEB (temperature/time) | Elution | Receding contact angle (degree) | Sensitivity (iii) (mJ/cm$^2$) | EL | Collapsing margin | Patten shape (iii) |
|---|---|---|---|---|---|---|---|---|
| Example 16 | 120° C./60 s | 115° C./60 s | Good | 78.1 | 49.14 | Good | Good | Good |
| Example 17 | 120° C./60 s | 115° C./60 s | Good | 78.2 | 49.22 | Good | Good | Good |
| Example 18 | 120° C./60 s | 115° C./60 s | Good | 80.7 | 52.18 | Good | Good | Good |
| Example 19 | 120° C./60 s | 115° C./60 s | Good | 80.9 | 50.52 | Good | Good | Good |
| Example 20 | 120° C./60 s | 115° C./60 s | Good | 81.5 | 45.02 | Good | Good | Good |

As can be seen from Tables 6 and 7, the radiation-sensitive resin composition for liquid immersion lithography to which the fluorine-containing polymer (A) of the present invention is added produces a resist film which elutes only a small amount of components in the liquid with which the resist comes in contact upon liquid immersion lithography, provides a high receding contact angle, and produces an excellent pattern shape. The resin composition is expected to play an important role in the lithographic technology which is miniaturized in the future.

In addition, as can be seen from the results shown in Table 8, the radiation-sensitive resin composition for liquid immersion lithography to which the fluorine-containing polymer (A) of the present invention is added produces a resist film which elutes only a small amount of components in the liquid with which the resist comes in contact upon liquid immersion lithography, provides a high receding contact angle, and exhibits excellent resist performance (sensitivity, depth of focus, pattern profile) in an experiment using an actual immersion scanning stepper. The resist film was confirmed to have an effect of significantly reducing watermark defects which are through to be originating from an ArF immersion scanning stepper. In regard to bridge defects resulting from the resist itself, there is no significant difference between the resist made from the radiation-sensitive resin composition for liquid immersion lithography of the present invention and a general resist, indicating that the resin composition is suitably used in liquid immersion lithography and is expected to play an important role in the lithographic technology which is miniaturized in the future.

Furthermore, as can be seen from the results shown in Table 9, the radiation-sensitive resin composition for liquid immersion lithography to which the fluorine-containing polymer (A) of the present invention is added produces a resist film which elutes only a small amount of components in the liquid with which the resist comes in contact upon liquid immersion lithography, provides a high receding contact angle, exhibits excellent resist performance (sensitivity, pattern profile) in an experiment using an actual immersion scanning stepper. The resist films were more excellent in the exposure margin and collapsing margin than the resist films of Comparative Examples 1 and 2. It is thus shown that the radiation-sensitive resin composition is suitably used in liquid immersion lithography and is expected to play an important role in the lithographic technology which is miniaturized in the future.

The polymers (A-12) and (A-13) in Table 2 was purified by the liquid-liquid purification method described in (II) above. The purification method is thus evaluated to be suitably used in the manufacture of the resin.

The invention claimed is:

1. A radiation-sensitive resin composition comprising:
    a fluorine-containing polymer consisting of: at least one first repeating unit represented by formula (1); and at least one second repeating unit represented by formula (2);
    an acid-unstable resin having an acid-unstable group, comprising a third repeating unit represented by formula (2);
    a radiation-sensitive acid generator;
    a nitrogen-containing compound; and
    a solvent,

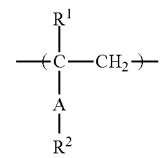

wherein:
    $R^1$ represents a hydrogen atom, a methyl group or a trifluoromethyl group;
    A represents a single bond, an oxygen atom, a sulfur atom, a carbonyloxy group, an oxycarbonyl group, an amide group, a sulfonylamide group, or a urethane group; and
    $R^2$ represents a linear or branched, partially or fully fluorinated alkyl group having 1 to 6 carbon atoms or a monovalent partially or fully fluorinated alicyclic hydrocarbon group having 4 to 20 carbon atoms,

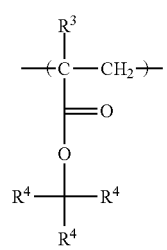

wherein:
    $R^3$ represents a hydrogen atom, a methyl group or a trifluoromethyl group; and
    each $R^4$ individually represents a monovalent alicyclic hydrocarbon group having 4 to 20 carbon atoms or a derivative thereof, or a linear or branched alkyl group having 1 to 4 carbon atoms, and optionally two of $R^4$s taken together represent a divalent alicyclic hydrocarbon group or a derivative thereof together with the carbon atom to which the two of $R^4$s bond,
    wherein an amount of the third repeating unit in the acid-unstable resin is from 53.8 to 69.6 mol % with respect to an amount of all repeating units in the acid-unstable resin.

2. The radiation-sensitive resin composition according to claim 1, wherein the acid-unstable resin further comprises a repeating unit comprising a lactone structure.

3. The radiation-sensitive resin composition according to claim 1, wherein the radiation-sensitive acid generator comprises an onium ion, the onium ion comprising:
    a cation; and
    an anion represented by $R^{17}C_nF_{2n}SO_3^-$, an anion represented by $R^{17}SO_3^-$, or both thereof, wherein $R^{17}$ represents a fluorine atom, a cycloalkyl group, or a bridge alicyclic hydrocarbon group, the cycloalkyl group and the bridge alicyclic hydrocarbon group having no more than 12 carbon atoms and optionally being substituted, and n is an integer of 1 to 10.

4. The radiation-sensitive resin composition according to claim 3, wherein the anion is represented by $R^{17}C_nF_{2n}SO_3^-$.

5. The radiation-sensitive resin composition according to claim 3, wherein $R^{17}$ is the bridge alicyclic hydrocarbon group.

6. The radiation-sensitive resin composition according to claim 3, wherein the anion is represented by $R^{17}C_nF_{2n}SO_3^-$, and $R^{17}$ is the bridge alicyclic hydrocarbon group.

7. The radiation-sensitive resin composition according to claim 3, wherein the cation is represented by formula (7-1),

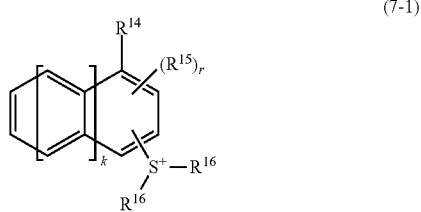

(7-1)

wherein $R^{14}$ represents a hydrogen atom, a fluorine atom, a hydroxyl group, a linear or branched alkyl group having 1 to 10 carbon atoms, a linear or branched alkoxyl group having 1 to 10 carbon atoms, or a linear or branched alkoxycarbonyl group having 2 to 11 carbon atoms;

$R^{15}$ represents a linear or branched alkyl group having 1 to 10 carbon atoms, or an alkoxyl group;

$R^{16}$ individually represents a linear or branched alkyl group having 1 to 10 carbon atoms, a substituted or unsubstituted phenyl group, or a substituted or unsubstituted naphthyl group, or two $R^{16}$s taken together represent a substituted or unsubstituted divalent group which comprises 2 to 10 carbon atoms;

k is an integer of 0 to 2; and r is an integer of 0 to 10.

8. The radiation-sensitive resin composition according to claim 7, wherein $R^{16}$ individually represents a substituted or unsubstituted phenyl group or a substituted or unsubstituted naphthyl group.

9. The radiation-sensitive resin composition according to claim 1, wherein an amount of the radiation-sensitive acid generator is from 0.5 to 10 parts by weight based on 100 parts by weight of a total of the fluorine-containing polymer and the acid-unstable resin.

10. The radiation-sensitive resin composition according to claim 1, wherein a content of the fluorine-containing polymer in the radiation-sensitive resin composition is 0.1% or more by weight based on 100% by weight of the radiation-sensitive resin composition.

11. The radiation-sensitive resin composition according to claim 1, wherein a content of the fluorine-containing polymer in the radiation-sensitive resin composition is from 0.5% to 35% by weight based on 100% by weight of the radiation-sensitive resin composition.

12. The radiation-sensitive resin composition according to claim 1, wherein the fluorine-containing polymer has a weight average molecular weight determined by gel permeation chromatography in a range from 1,000 to 50,000.

13. The radiation-sensitive resin composition according to claim 1, wherein the nitrogen-containing compound comprises at least one of an amine compound, an amide group-containing compound, a urea compound, or a nitrogen-containing heterocyclic compound.

14. The radiation-sensitive resin composition according to claim 1, wherein an amount of the radiation-sensitive acid generator is from 7 to 9.5 parts by weight based on 100 parts by weight of the acid-unstable resin.

* * * * *